United States Patent
Miyairi

(10) Patent No.: US 7,960,262 B2
(45) Date of Patent: Jun. 14, 2011

(54) METHOD FOR MANUFACTURING SEMICONDUCTOR DEVICE BY APPLYING LASER BEAM TO SINGLE-CRYSTAL SEMICONDUCTOR LAYER AND NON-SINGLE-CRYSTAL SEMICONDUCTOR LAYER THROUGH CAP FILM

(75) Inventor: Hidekazu Miyairi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/078,215

(22) Filed: Mar. 28, 2008

(65) Prior Publication Data

US 2008/0286911 A1 Nov. 20, 2008

(30) Foreign Application Priority Data

May 18, 2007 (JP) ................. 2007-132540

(51) Int. Cl.
*H01L 21/20* (2006.01)
*H01L 21/36* (2006.01)
*H01L 21/00* (2006.01)
*H01L 21/84* (2006.01)
*H01L 21/331* (2006.01)
*H01L 27/12* (2006.01)

(52) U.S. Cl. ........ 438/487; 438/166; 438/378; 438/458; 438/478; 438/479; 438/480; 438/486; 257/347

(58) Field of Classification Search .................. 438/480, 438/487, 486
See application file for complete search history.

(56) References Cited

U.S. PATENT DOCUMENTS

| | | | |
|---|---|---|---|
| 5,528,397 A * | 6/1996 | Zavracky et al. ............... 349/42 |
| 5,643,826 A | 7/1997 | Ohtani et al. | |
| 5,744,824 A | 4/1998 | Kousai et al. | |
| 5,923,962 A | 7/1999 | Ohtani et al. | |
| 6,285,042 B1 | 9/2001 | Ohtani et al. | |
| 6,335,231 B1 | 1/2002 | Yamazaki et al. | |
| 6,335,541 B1 | 1/2002 | Ohtani et al. | |
| 6,534,380 B1 | 3/2003 | Yamauchi et al. | |
| 6,998,639 B2 | 2/2006 | Ohtani et al. | |
| 2004/0061176 A1 | 4/2004 | Takafuji et al. | |
| 2006/0131583 A1 | 6/2006 | Ohtani et al. | |
| 2007/0063281 A1* | 3/2007 | Takafuji et al. ............... 257/347 |
| 2007/0087488 A1* | 4/2007 | Moriwaka ..................... 438/149 |
| 2008/0246109 A1 | 10/2008 | Ohnuma et al. | |
| 2008/0299743 A1 | 12/2008 | Miyairi | |
| 2009/0039349 A1 | 2/2009 | Honda | |

FOREIGN PATENT DOCUMENTS

JP 07-130652 5/1995

(Continued)

*Primary Examiner* — N Drew Richards
*Assistant Examiner* — Michael Jung
(74) *Attorney, Agent, or Firm* — Eric J. Robinson; Robinson Intellectual Property Law Office, P.C.

(57) ABSTRACT

To provide a low-cost high performance semiconductor device and a method for manufacturing the semiconductor device, a separate single-crystal semiconductor layer having a first region and a non-single-crystal semiconductor layer having a second region are provided over a substrate. Further, it is preferable that a cap film is formed over either the separate single-crystal semiconductor layer or the non-single-crystal semiconductor layer, and the first region and the second region are irradiated with a laser beam by applying the laser beam from above the cap film.

23 Claims, 18 Drawing Sheets

FOREIGN PATENT DOCUMENTS

| | | |
|---|---|---|
| JP | 11-097379 | 4/1999 |
| JP | 11-163363 | 6/1999 |
| JP | 2000-294754 | 10/2000 |
| JP | 2005-203596 | 7/2005 |
| JP | 2005-252244 | 9/2005 |

* cited by examiner

METHOD FOR MANUFACTURING SEMICONDUCTOR DEVICE BY APPLYING LASER BEAM TO SINGLE-CRYSTAL SEMICONDUCTOR LAYER AND NON-SINGLE-CRYSTAL SEMICONDUCTOR LAYER THROUGH CAP FILM

BACKGROUND OF THE INVENTION

1. Field of the Invention

The present invention relates to a semiconductor device and a method for manufacturing the same.

2. Description of the Related Art

The history of developing semiconductor devices having transistors using semiconductors has been a history of the challenge of providing higher performance semiconductor devices at lower cost.

One of methods for improving the performance of semiconductor devices is to improve crystallinity of a semiconductor.

Single-crystal semiconductors have the highest crystallinity.

Single-crystal semiconductor wafers, SOI (Silicon on Insulator) substrates, and the like are given as substrates for single-crystal semiconductors.

However, such substrates have disadvantages of high cost. The disadvantages are more significant as the substrates have larger area.

On the other hand, semiconductor devices using semiconductors formed on low-cost substrates (for example, glass substrates) by a film formation method are given as low-cost semiconductor devices in which larger substrates are suitably used.

Further, regarding a semiconductor device using a semiconductor formed on a substrate by a film formation method, there have been attempts to provide higher performance semiconductor devices at low cost, in which crystallinity of a semiconductor is improved (for example, Reference 1: Japanese Published Patent Application No. H7-130652).

However, it is very difficult to make a perfect single-crystal semiconductor from a semiconductor formed on a substrate by a film formation method.

In response, there have also been attempts to form a single-crystal semiconductor on a low-cost substrate by attaching a single-crystal semiconductor onto a low-cost substrate (Reference: Japanese Published Patent Application No. H11-163363).

SUMMARY OF THE INVENTION

With the invention disclosed in Reference 2, high performance semiconductor devices can be provided at low cost; however, since a single-crystal semiconductor is used, the cost is higher compared with the cost involved in the case of using the invention disclosed in Reference 1.

Here, a semiconductor device has various circuits, and there are cases where not all the circuits are necessarily formed using a single crystal, but only some high performance circuits should be formed using a single crystal.

In view of the above problems, it is an object of the present invention to provide a low-cost high performance semiconductor device and a method for manufacturing the semiconductor device.

A semiconductor device of the present invention includes a first region having a separate single-crystal semiconductor layer and a second region having a non-single-crystal semiconductor layer, over a substrate.

Further, circuits required to achieve high performance (high crystallinity, less variation in performance of semiconductor elements in the substrate surface, or the like) are disposed in the first region, and circuits which are not necessarily required to achieve such high performance are disposed in the second region.

Here, a separate single-crystal semiconductor layer refers to a single-crystal semiconductor layer obtained through the following steps: a single-crystal semiconductor substrate is implanted or doped with ion species composed of one or more atoms of hydrogen, helium, and halogen; an ion layer is formed at a predetermined depth from a surface of the single-crystal semiconductor substrate in the single-crystal semiconductor substrate; a bond layer is formed over a surface of the single-crystal semiconductor substrate; the bond layer is attached onto a substrate; and energy is applied to the single-crystal semiconductor substrate so as to create a crack in the ion layer; thus, the single-crystal semiconductor layer remains on the substrate.

Note that in this specification, "to implant ion species" means to introduce a source gas containing ion species which have been mass-separated, into an object. On the other hand, "doping with ion species" means to introduce a source gas containing ion species which have not been mass-separated, into an object. Further, since an ion doping apparatus is not required to have a mass separator, it is more inexpensive as compared with an ion implanter. Accordingly, doping is preferably used to introduce ion species.

Further, it is a feature of a method for manufacturing a semiconductor device in the present invention that when a plurality of regions having different optimal energy density for laser irradiation is irradiated with a laser beam, a cap film with respect to the laser beam is provided over any of the regions, and after that, the plurality of the regions is irradiated with the laser beam all at once.

Alternatively, in another method for manufacturing a semiconductor device in the present invention, when a plurality of regions having different optimal energy density for laser irradiation is irradiated with a laser beam, a cap film having different absorptance with respect to the laser beam is provided over each of the regions, and after that, the plurality of the regions is irradiated with the laser beam all at once.

"To irradiate something all at once" means to irradiate something in one step (in the same step or simultaneously). To entirely scan a substrate with a linear laser beam or a spot laser beam, or to entirely irradiate a substrate using a planar laser beam, and the like can be given as examples.

Note that the optimal energy density for laser irradiation of a semiconductor layer varies depending on the film thickness of the semiconductor layer.

Further, even if semiconductor layers have the same thickness, if they are formed from different materials, the optimal energy densities vary accordingly.

The smaller the thickness of a semiconductor layer is, the lower the optimal energy density is, and the larger the thickness of a semiconductor layer is, the higher the optimal energy density is. For example, in the case of using silicon, the optimal value is 350 mJ/cm$^2$ to 450 mJ/cm$^2$ when the thickness of a semiconductor layer is 50 n, and 600 mJ/cm$^2$ to 700 mJ/cm$^2$ when the thickness of the semiconductor layer is 100 nm.

Evaluation may be performed in advance by a method in which semiconductor samples irradiated with laser beams under different conditions of energy density are prepared and observed using a microscope to evaluate crystallinity, a method in which crystallinity is evaluated using a Raman spectrometer, or a method in which thin film transistors are actually manufactured and evaluated, to calculate the optimal energy density.

Note that a cap film is formed over a top face of the semiconductor layer.

The cap film may be an anti-reflective film or a reflective film.

In the case of forming an anti-reflective film as a cap film, reflectance is low (absorptance is relatively high) as compared with the case of not forming the cap film.

As the anti-reflective film, a single layer of a silicon oxide film, a silicon nitride film, a silicon nitride oxide film, a silicon oxynitride film, or the like can be used.

On the other hand, in the case of forming a reflective film as a cap film, reflectance is high (absorptance is relatively low) as compared with the case of not forming the cap film.

As the reflective film, a film laminate of plural kinds of films selected from a silicon oxide film, a silicon nitride film, a silicon nitride oxide film, a silicon oxynitride film, and the like can be used.

In this specification, a silicon oxynitride film and a silicon nitride oxide film are defined as follows. A silicon oxynitride film is a film containing oxygen at 50 atomic % to 70 atomic %, nitrogen at 0.5 atomic % to 15 atomic %, silicon at 25 atomic % to 35 atomic %, and hydrogen at 0.1 atomic % to 10 atomic %. Meanwhile, a silicon nitride oxide film is a film containing oxygen at 5 atomic % to 30 atomic %, nitrogen at 20 atomic % to 55 atomic %, silicon at 25 atomic % to 35 atomic %, and hydrogen at 10 atomic % to 25 atomic %. The values of proportions are obtained by converting values measured using Rutherford backscattering spectrometry (RBS) and hydrogen forward scattering spectrometry (HFS) into proportions of the four elements of oxygen, nitrogen, silicon, and hydrogen.

Here, the cap film is provided to change absorptance, reflectance, and transmittance of a laser beam by changing the optical path length of the laser beam. Note that the absorptance, the reflectance, and the transmittance add up to 1.

An optical path length is the product (ns) of a geometric length (s) through which light travels and the refractive index (n) of a medium through which light travels.

An optical path length can be changed freely by suitably selecting the material of the cap film to control the refractive index (n) and by changing the thickness of the cap film to control the geometric length (s) of regions having different refractive indices.

Further, the energy applied to the semiconductor layer is proportional to the absorptance.

Thus, the optical path length can be changed by suitably determining the material and the thickness of the cap film. Further, absorptance of the laser beam can be changed by changing the optical path length. Moreover, energy applied to the semiconductor layer can be changed by changing the absorptance of the laser beam. Accordingly, the energy applied to the semiconductor layer can be changed by selecting the material and the thickness of the cap film.

Specifically, the optimal energy density tends to be higher as the thickness of the semiconductor layer is larger; therefore, an anti-reflective film may be provided over a semiconductor layer having a larger film thickness.

Alternatively, a reflective film may be provided over a semiconductor layer having a smaller thickness.

Further, in the case where a first semiconductor layer and a second semiconductor layer having larger thickness than the first semiconductor layer are provided, a first cap film is provided over the first semiconductor layer, and a second cap film is provided over the second semiconductor layer; the first cap film preferably has higher absorptance than the second cap film.

It is still another feature of a semiconductor device of the present invention that a first region provided with a separate single-crystal semiconductor layer and a second region provided with a non-single-crystal semiconductor layer are provided over a substrate, and the thickness of the separate single-crystal semiconductor layer is larger than the thickness of the non-single-crystal semiconductor layer.

Further, it is preferable in semiconductor device of the present invention that a driver circuit be formed in the first region, and a pixel area having a liquid crystal display element be formed in the second region.

Alternatively, it is preferable in a semiconductor device of the present invention that a pixel area having an electroluminescent display element be formed in the first region, and a driver circuit be formed in the second region.

Still alternatively, it is preferable that in a semiconductor device of the present invention, an analog circuit be formed in the first region, and a digital circuit be formed in the second region.

Further, in a method for manufacturing a semiconductor device of the present invention, a first region provided with a separate single-crystal semiconductor layer and a second region provided with a non-single-crystal semiconductor layer are formed over a substrate, a cap film is formed over either the separate single-crystal semiconductor layer or the non-single-crystal semiconductor layer, and the first region and the second region are irradiated with a laser beam by applying the laser beam from above the cap film.

Further, in a method for manufacturing a semiconductor device of the present invention, a first region provided with a separate single-crystal semiconductor layer and a second region provided with a non-single-crystal semiconductor layer are formed over a substrate; a first cap film and a second cap film having a different reflectance from the first cap film are formed over the separate single-crystal semiconductor layer and the non-single-crystal semiconductor layer, respectively; and the first region and the second region are irradiated with a laser beam by applying the laser beam from above the first cap film and the second cap film.

Further, in a method for manufacturing a semiconductor device of the present invention, a non-single-crystal semiconductor film is formed over a substrate; the non-single-crystal semiconductor film in the first region over the substrate is removed, thereby forming a non-single-crystal semiconductor layer in the second region over the substrate; a single-crystal semiconductor substrate is implanted or doped with ion species, an ion layer is formed in a region at a predetermined depth from a surface of the single-crystal semiconductor substrate; a bond layer is formed on the surface of the single-crystal semiconductor substrate; the bond layer is attached to the first region, and energy is applied to the single-crystal semiconductor substrate to create a crack in the ion layer, thereby leaving a single-crystal semiconductor layer in the first region; a cap film is formed over either the single-crystal semiconductor layer or the non-single-crystal semiconductor layer; and the first region and the second region are irradiated with a laser beam by applying the laser beam from above the cap film.

Further, in a method for manufacturing a semiconductor device of the present invention, a non-single-crystal semiconductor film is formed over a substrate; the non-single-crystal film in a first region over the substrate is removed, thereby forming a non-single-crystal semiconductor layer in a second region over the substrate; a cap film is formed over the first region and the second region; a single-crystal semiconductor substrate is implanted or doped with ion species, thereby forming an ion layer in a region at a predetermined depth from a surface of the single-crystal semiconductor substrate; a bond layer is formed on the surface of the single-crystal semiconductor substrate; the bond layer is attached onto the first region; energy is applied to the single-crystal semiconductor substrate to create a crack in the ion layer, thereby leaving a single-crystal semiconductor layer in the first region; and the first region and the second region are irradiated with a laser beam by applying the laser beam from above the cap film.

Further, in a method for manufacturing a semiconductor device of the present invention, a single-crystal semiconductor substrate is implanted or doped with ion species, thereby forming an ion layer in a region at a predetermined depth from a surface of the single-crystal semiconductor substrate; a bond layer is formed on the surface of the single-crystal semiconductor substrate; the bond layer is bonded to a first region over the substrate; energy is applied to the single-crystal semiconductor substrate to create a crack in the ion layer, thereby leaving a single-crystal semiconductor layer in the first region; a cap film is formed in the first region and a second region over the substrate; a non-single-crystal semiconductor film is formed over the cap film; the non-single-crystal film in the first region is removed using the cap film as an etching stopper, thereby forming a non-single-crystal semiconductor layer in the second region; and the first region and the second region are irradiated with a laser beam by applying the laser beam from above the cap film.

Further, in a method for manufacturing a semiconductor device of the present invention, a non-single-crystal semiconductor film is formed over a substrate; the non-single-crystal film in a first region over the substrate is removed, thereby forming a non-single-crystal semiconductor layer in a second region over the substrate; a single-crystal semiconductor substrate is implanted or doped with ion species, thereby forming an ion layer in a region at a predetermined depth from a surface of the single-crystal semiconductor substrate; a bond layer is formed on the surface of the single-crystal semiconductor substrate; the bond layer is attached to the first region; energy is applied to the single-crystal semiconductor substrate to create a crack in the ion layer, thereby leaving a single-crystal semiconductor layer in the first region; a first cap film is formed over the single-crystal semiconductor layer; a second cap film having a different reflectance from the first cap film is formed over the non-single-crystal semiconductor layer; and the first region and the second region are irradiated with a laser beam by applying the laser beam from above the first cap film and the second cap film.

Further, in a method for manufacturing a semiconductor device of the present invention, the thickness of the separate single-crystal semiconductor layer is preferably larger than the thickness of the non-single-crystal semiconductor layer.

Further, it is preferable in a method for manufacturing a semiconductor device of the present invention that a driver circuit be formed in the first region, and a pixel area having a liquid crystal display element be formed in the second region.

Alternatively, it is preferable that in a method for manufacturing a semiconductor device of the present invention, an analog circuit be formed in the first region, and a digital circuit be formed in the second region.

Still alternatively, it is preferable that in a method for manufacturing a semiconductor device of the present invention in, an analog circuit be formed in the first region, and a digital circuit be formed in the second region.

Note that energy of the laser beam is set under an optimal condition determined using a laser irradiation test substrate formed from a non-single-crystal semiconductor.

A first region having a separate single-crystal semiconductor layer and a second region having a non-single-crystal semiconductor layer are formed over a substrate; thus, a high performance semiconductor device can be provided at low cost.

Further, irradiation with a laser beam is performed on objects all at once using a cap film, so that a semiconductor itself can have good quality, and the number of irradiations with a laser beam can be reduced; thus, a high performance semiconductor device can be provided at low cost.

BRIEF DESCRIPTION OF THE DRAWINGS

In the accompanying drawings.

DETAILED DESCRIPTION OF THE INVENTION

Embodiment Mode

Figure 1:
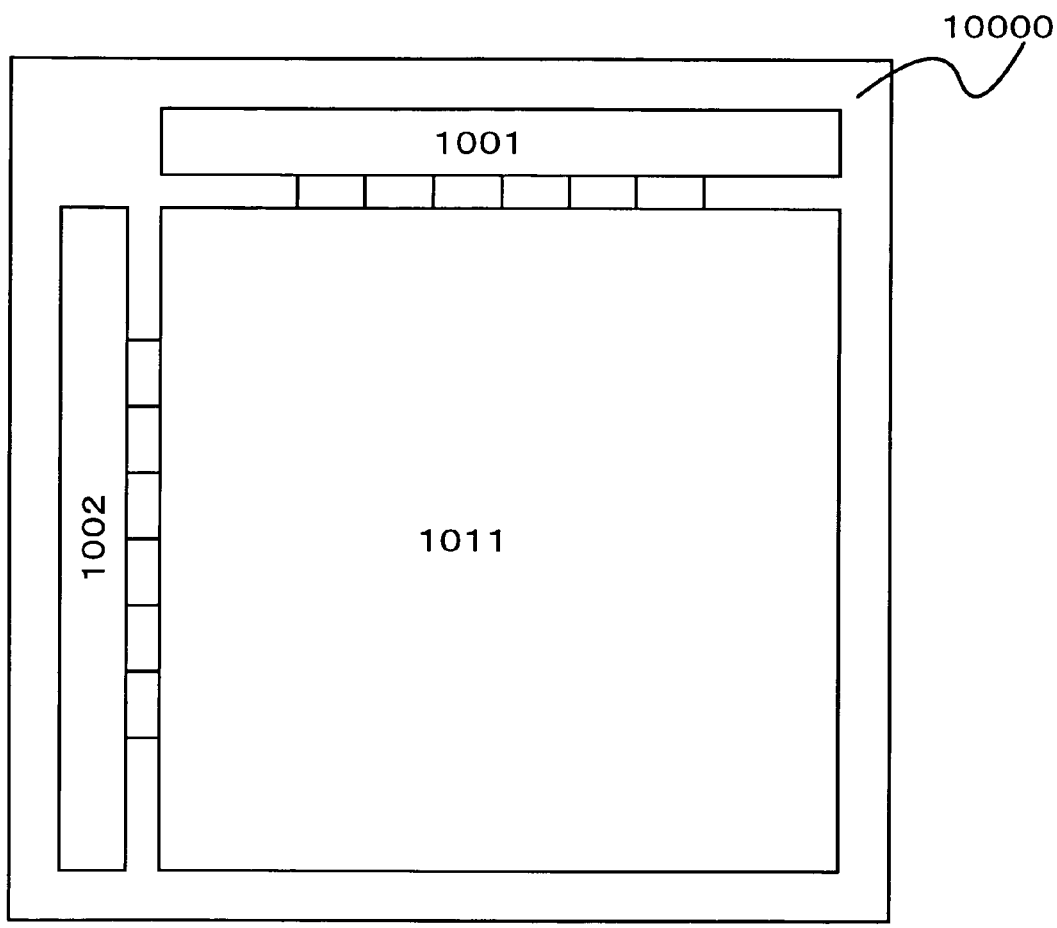
FIG. 1 is a plan view illustrating an active matrix display device.

Hereinafter, embodiment modes and embodiments of the present invention will be described with reference to the accompanying drawings. Note that the present invention can be implemented in many different modes and it will be readily appreciated by those skilled in the art that modes and details can be modified in various ways without departing from the spirit and scope of the present invention. Accordingly, the present invention should not be construed as being limited to the description of the embodiment modes and embodiments, and the drawings.

Note that the embodiment modes below can be combined as appropriate. Further, unless otherwise indicated, parts denoted by the same reference numerals in the drawings can be formed using the same materials, the same method, and the like.

Embodiment Mode 1

In this embodiment mode, a display device including a first region having a separate single-crystal semiconductor layer and a second region having a non-single-crystal semiconductor layer will be described.

FIG. 1 is an example of a plan view of an active matrix liquid crystal display device, an active matrix electroluminescent display device, or the like.

In the active matrix display device, driver circuits such as a source driver circuit 1001 and a gate driver circuit 1002 are connected to a pixel area 1011, over a substrate 10000.

The driver circuits such as the source driver circuit 1001 and the gate driver circuit 1002 are circuits for controlling signals which are supplied to active elements such as transistors which are formed over the pixel area 1011.

Further, in a liquid crystal display device, switching of liquid crystal display elements is controlled by the transistors formed in the pixel area 1011.

Thus, since the transistors in the pixel area 1011 of the liquid crystal display device are used for only switching, they are not required to achieve high performance as compared with driver circuits.

On the other hand, since liquid crystal display elements have low response speed, the response speed of a liquid crystal display device should be increased by controlling drive signals.

In the case of adjusting drive signals to increase response speed, circuit configuration of a driver circuit is complicated, and the number of transistors in the driver circuit is increased accordingly.

However, if the number of the transistors is increased, the operation speed of the driver circuit itself decreases.

Therefore, a high performance semiconductor layer is required for transistors in the driver circuit (high field effect mobility, less variation in characteristics of the transistors on the substrate).

In view of the above, in the liquid crystal display device, it is desirable that a region where the driver circuits such as the source driver circuit 1001 and the gate driver circuit 1002 are provided is formed in a separate single-crystal semiconductor layer, and a region in which the pixel area 1011 is provided is formed in a non-single-crystal semiconductor layer.

Further, the area of the pixel area 1011 is larger than the area occupied by the driver circuits; therefore, the pixel area 1011 is provided in a non-single-crystal semiconductor layer, so that a low-cost display device can be obtained.

Next, in the case of an electroluminescent display device, light is emitted from an electroluminescent element by applying voltage to the electroluminescent element using transistors formed in the pixel area 1011.

In the electroluminescent display device, intensity of light emitted from the electroluminescent element varies depending on the voltage applied.

Further, in the case of a full color electroluminescent display device, the optimal voltage for light emission varies between elements for red, green, and blue.

Accordingly, variation of performance of transistors on the substrate easily affects display quality of the electroluminescent display device.

On the other hand, since an electroluminescent element emits light when voltage is applied, response speed of an electroluminescent element is remarkably higher as compared with that of a liquid crystal display element.

Accordingly, the circuit configuration of an electroluminescent element is not so complicated as that of a liquid crystal display device.

From the above, it is desirable that in the electroluminescent display device, a region in where the pixel area 1011 is provided be formed in a separate single-crystal semiconductor layer, and a region where the driver circuits such as the source driver circuit 1001 and the gate driver circuit 1002 are provided be formed in a non-single-crystal semiconductor layer.

Embodiment Mode 2

In this embodiment mode, a semiconductor device capable of inputting/outputting data without contact, which includes a first region having a separate single-crystal semiconductor layer and a second region having a non-single-crystal semiconductor layer will be described.

Semiconductor devices capable of inputting/outputting data without contact are referred to as an RFID tag, an ID tag, an IC tag, an IC chip, an RF tag, a wireless tag, an electronic tag, or a wireless chip depending on the usage patterns. They are generically referred to as contactless tags (contactless chips).

Figure 2:
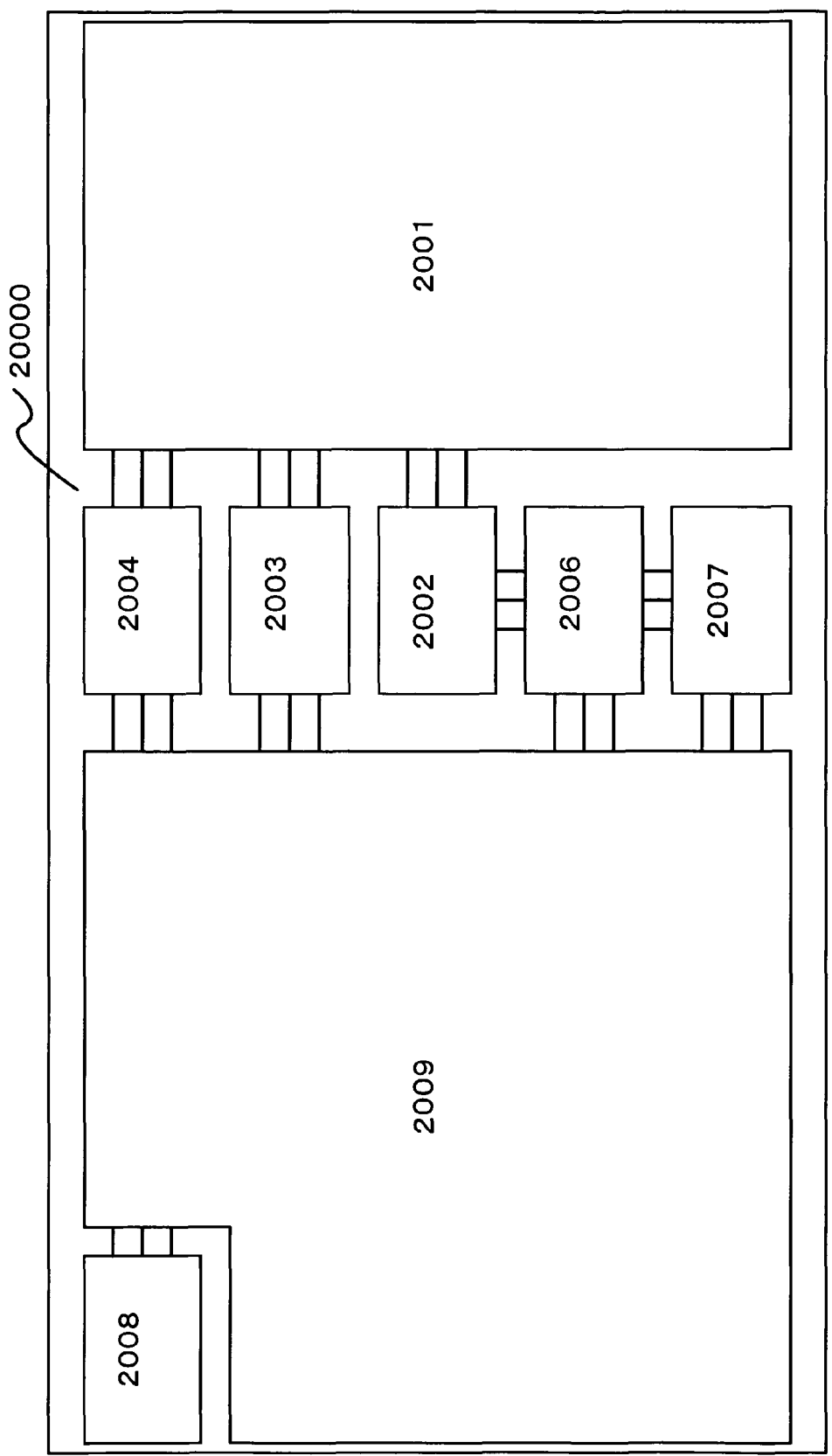
FIG. 2 is a plan view illustrating a contactless tag.
Figure 3:
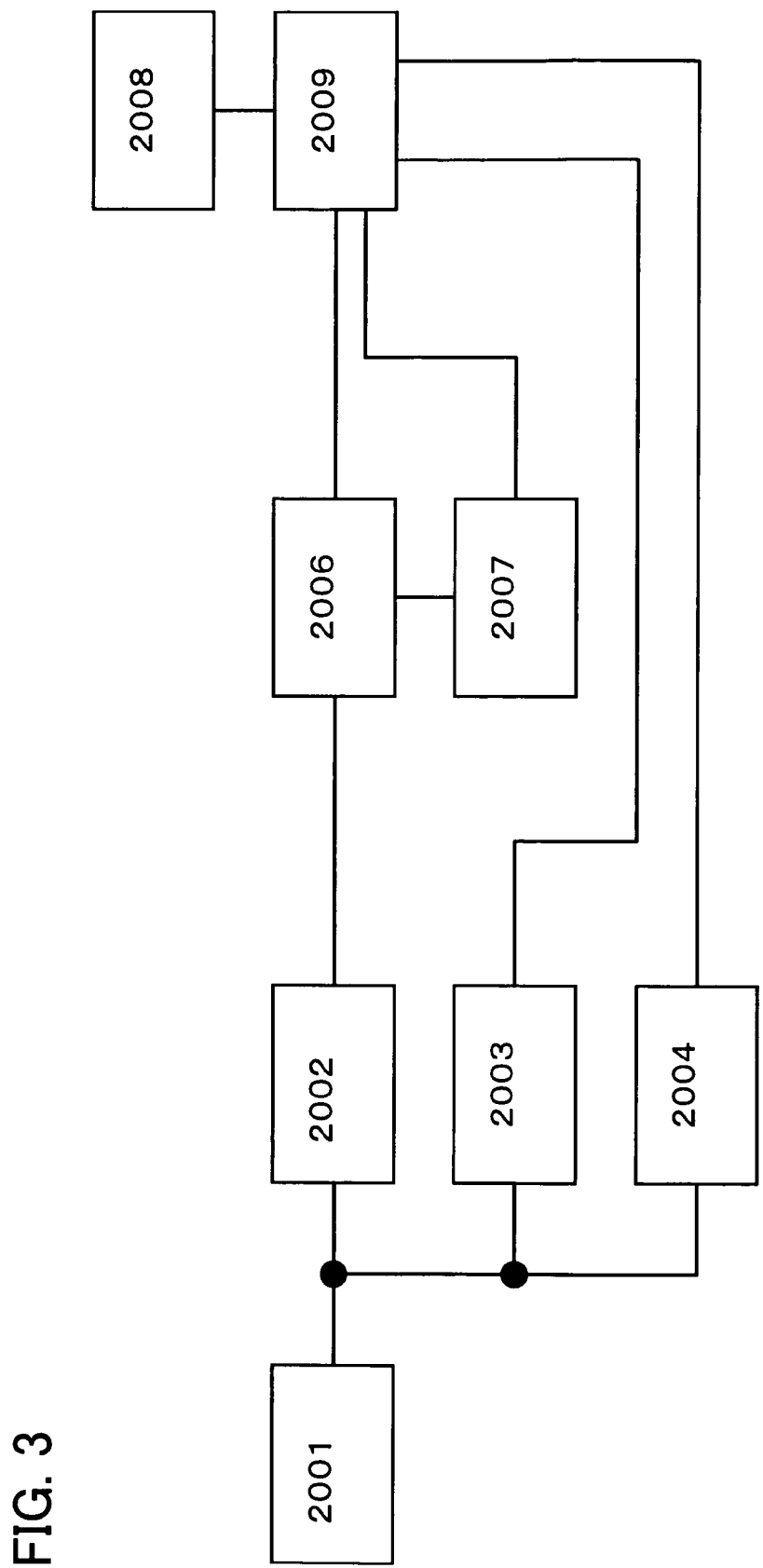
FIG. 3 is a block diagram illustrating a contactless tag.

FIG. 2 illustrates an example of a plan view of a contactless tag and FIG. 3 illustrates an example of a circuit diagram of a contactless tag.

An antenna 2001, a rectification circuit 2002, a demodulation circuit 2003, a modulation circuit 2004, a regulator 2006, a VCO 2007, a memory 2008, and a logic circuit 2009 are provided over a substrate 20000. Note that the VCO refers to a voltage controlled oscillator.

The rectification circuit 2002, the demodulation circuit 2003, and the modulation circuit 2004 are electrically connected to the antenna 2001.

The demodulation circuit 2003, the modulation circuit 2004, the regulator 2006, the VCO 2007, and the memory 2008 are electrically connected to the logic circuit 2009.

Further, the rectification circuit 2002 and the regulator 2006 are electrically connected to each other, and the regulator 2006 and the VCO 2007 are electrically connected to each other.

The operation of the contactless tag will be described.

The contactless tag operates in combination with a reader/writer.

A supply voltage signal and a command signal are generated from the reader/writer.

Further, the contactless tag receives the supply voltage signal and the command signal by the antenna 2001.

The supply voltage signal received by the contactless tag is rectified by the rectification circuit 2002 and then supplied to the regulator 2006.

The regulator 2006 converts the rectified supply voltage signal into a predetermined voltage and transmits it to the VCO 2007 and the logic circuit 2009.

The VCO 2007 converts the predetermined voltage transmitted from the regulator 2006 into a predetermined frequency (clock) and transmits it to the logic circuit 2009.

On the other hand, the command signal received by the contactless tag is demodulated by the demodulation circuit 2003 and transmitted to the logic circuit 2009.

The logic circuit 2009 operates with the voltage supplied from the regulator 2006 and analyzes the signal supplied from the demodulation circuit 2003 by comparing it with data stored in the memory 2008.

After the analysis, the outputted result is transmitted as a signal to the modulation circuit 2004.

Further, the answering signal transmitted from the modulation circuit 2004 through the antenna 2001 is read by the reader/writer.

As described above, the reader/writer and the contactless tag exchange data.

Here, the logic circuit 2009, the memory 2008, and the modulation circuit 2004 are digital driver circuits, and the rectification circuit 2002, the demodulation circuit 2003, the regulator 2006, and the VCO 2007 are analog driver circuits.

An analog circuit controls operation depending on the physical quantity which changes continuously, so that it is preferable to use transistors using a separate single-crystal semiconductor.

On the other hand, a digital circuit controls operation depending on the discrete physical quantity, so that transistors with performance inferior to those used for the analog driver circuit may be used.

Accordingly, it is preferable that transistors of the analog driver circuits are formed using a separate single-crystal semiconductor and transistors of the digital driver circuits are formed using a non-single-crystal semiconductor.

Note that the modulation circuit 2004 is a digital driver circuit; however, since the circuit configuration is simple, it occupies a small area over the substrate. Therefore, the modulation circuit 2004 can be formed using a separate single-crystal semiconductor and can be integrated and disposed in an unoccupied space; thus, high integration can be achieved.

Embodiment Mode 3

In this embodiment mode, a method for forming a separate single-crystal semiconductor layer will be described with reference to FIGS. 4A to 4C and FIG. 5.

First, a semiconductor substrate is prepared. As the semiconductor substrate, a substrate formed of single-crystal silicon, a single-crystal gallium arsenide substrate, or the like can be used. Further, a semiconductor substrate formed of polycrystals of silicon, or germanium-gallium arsenide, or a substrate on which silicon, germanium-gallium arsenide, or the like is formed, can be used.

Note that in the case where a polycrystalline semiconductor substrate is used, a separated semiconductor layer is a separate polycrystalline layer.

Figure 4A:
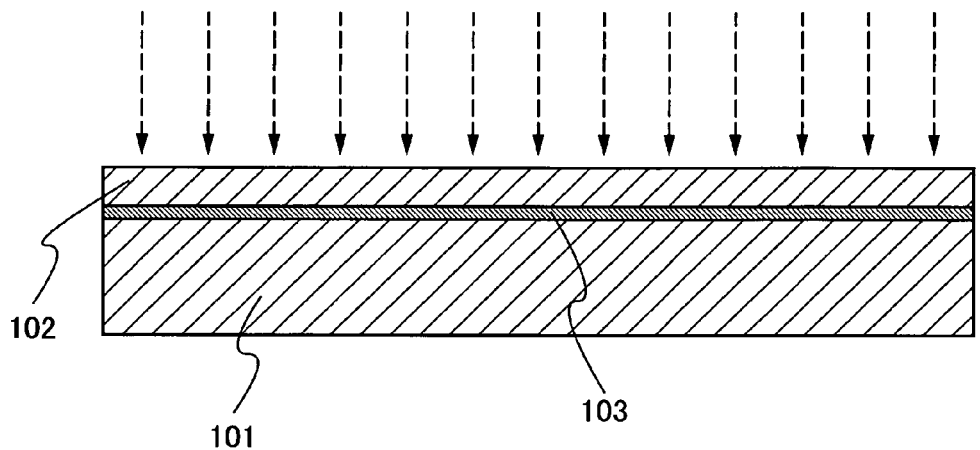
FIGS. 4A to 4C illustrate a method for forming a separate single-crystal semiconductor layer.

Next, after cleaning a surface of the semiconductor substrate, the semiconductor substrate is implanted or doped with ions accelerated by an electric field from the surface side at a predetermined depth, thereby an ion layer 103 is formed between the first single-crystal semiconductor layer 101 and the second single-crystal semiconductor layer 102 (FIG. 4A).

The position where the ion layer 103 is formed depends on the acceleration of the ions. Accordingly, the thickness of the second single-crystal semiconductor layer 102 can be controlled by determining the acceleration of the ions.

The thickness of the second single-crystal semiconductor layer 102 is 5 nm to 500 nm, preferably 10 nm to 200 nm.

Ions introduced by implantation or doping may be one or more ions species of one atom selected from hydrogen, helium, or halogen.

In the case where doping with hydrogen ions is performed, a plurality of ions having different number of hydrogen atoms, that is, ions of $H^+$, $H_2^+$, and $H_3^+$ are used. Further, when the proportion of $H_3^+$ ions is the highest among the ions applied by irradiation, the mass of hydrogen introduced by doping per unit time is increased; thus, the time required for doping can be reduced.

Further, if ion implantation or ion doping is performed in a state where the surface of the semiconductor substrate is bare, the surface would be rough.

In response, a protective film having a thickness of 50 nm to 200 nm is preferably provided over the surface of the semiconductor substrate because roughness of the surface can be prevented, and precision of controlling the depth of ion implantation or ion doping is increased through the protective film.

The protective film is preferably formed by forming a silicon oxide film over the surface of the semiconductor substrate, and stacking a silicon nitride film or a silicon nitride oxide film on the silicon oxide film.

Such a protective film is preferable because, after attachment, contaminants from the substrate can be prevented by the silicon nitride film or the silicon nitride oxide film, and the silicon oxide film can serve as a base film with which good interface characteristics between the base and the semiconductor can be obtained.

Figure 4B:
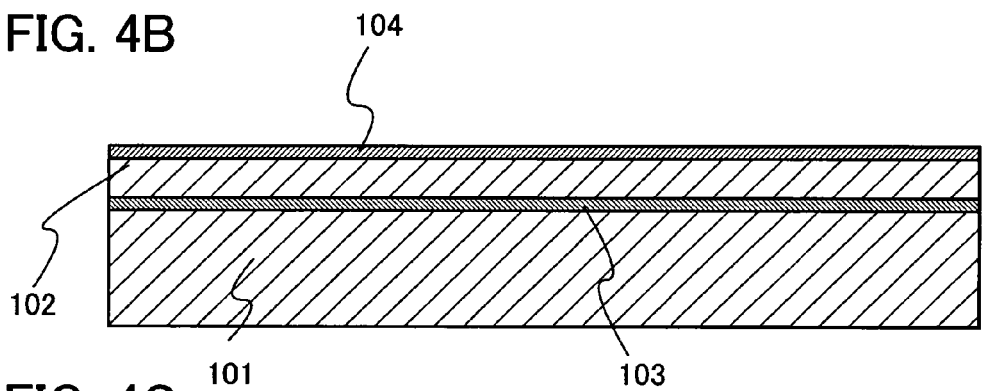

Next, a silicon oxide film is formed as a bond layer 104 on the substrate surface side (FIG. 4B).

As the bond layer 104, a silicon oxide film which is formed by chemical vapor deposition using an organosilane gas is preferable.

As the organosilane gas, a silicon containing compound such as tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

A silicon oxide film formed by chemical vapor deposition using an organosilane gas as described above is referred to as an organosilane film.

As to the organosilane film, reactant moves quickly on the reaction surface in the film formation; therefore, a film having a flat surface with high step coverage can be obtained.

Figure 4C:
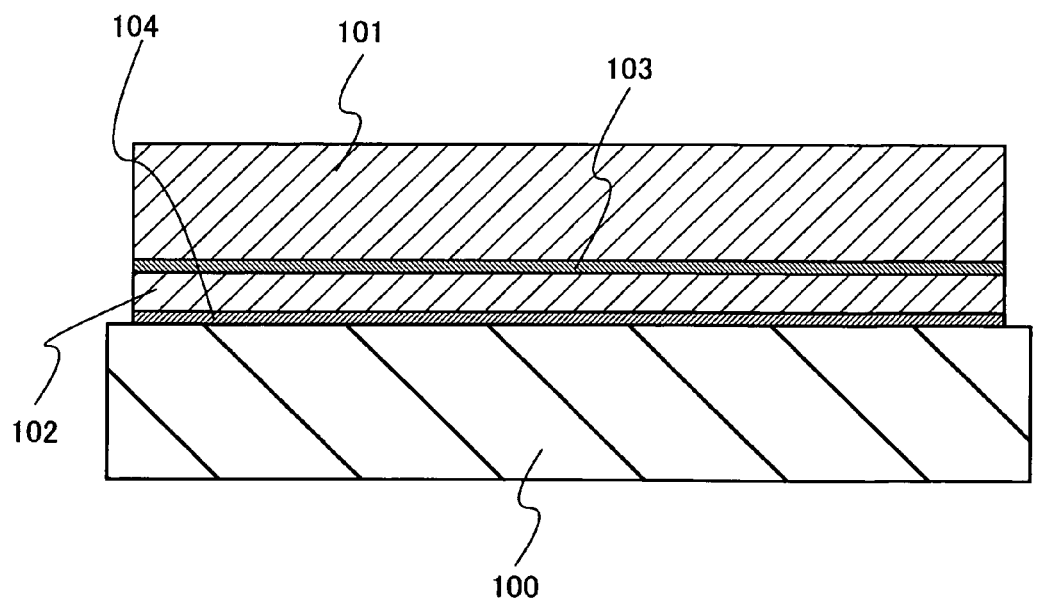

Next, a surface of a base substrate 100 and a surface of the bond layer 104 are cleaned. Then, the surface of the base substrate 100 and the surface of the bond layer 104 are bonded to each other by contact (FIG. 4C).

They can be bonded to each other only by contact because both the surface of the bond layer 104 and the surface of the base substrate 100 are flat.

If one or both of the surface of the bond layer 104 and the surface of the base substrate 100 are not flat, the adhesion is reduced.

Figure 5:
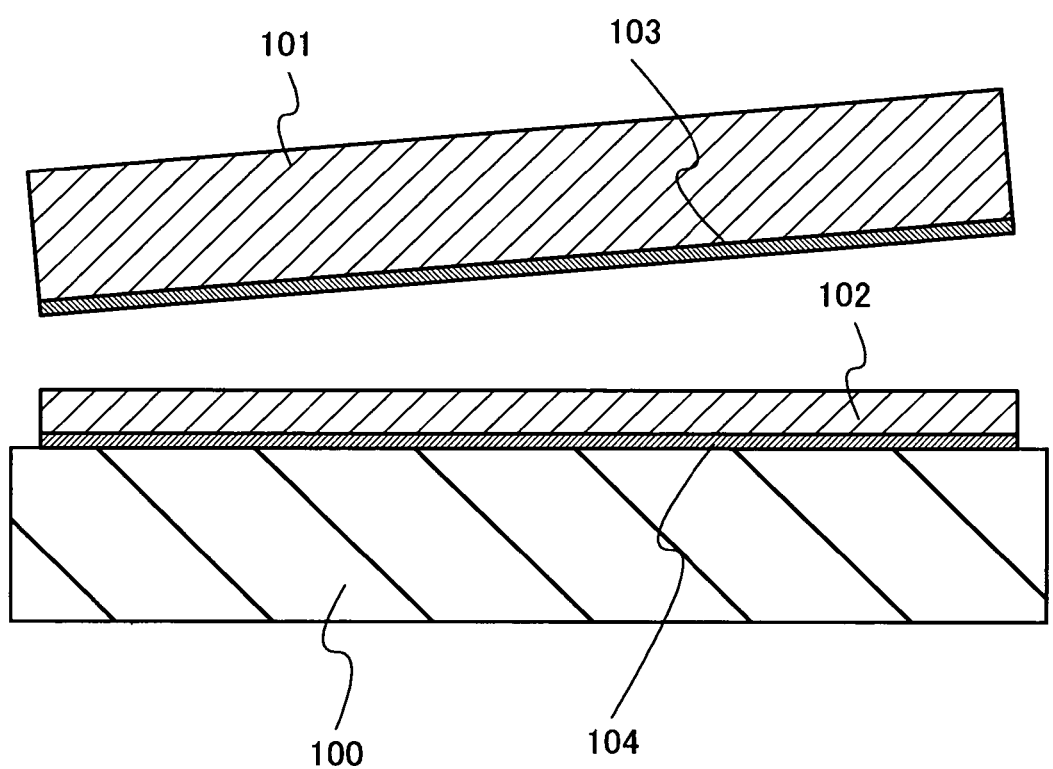
FIG. 5 illustrates a method for forming a separate single-crystal semiconductor layer.

Next, a crack is created along the ion layer 103 (which may also referred to as a separation layer, a fragile layer, or a release layer) by performing heat treatment which applies energy to the semiconductor substrate, thereby the first single-crystal semiconductor layer 101 is separated (FIG. 5).

Crack creation mechanism is as follows. First, voids are generated in the semiconductor substrate by ion implantation or ion doping. Secondly, the voids are grown by heat treatment to form cavities. Thirdly, the cavities are connected to form a crack. Note that FIG. 5 illustrates an example in which a crack is created so that the ion layer 103 remains on the first single-crystal semiconductor layer 101; however, the present invention is not limited thereto. The crack may be created so that the ion layer 103 remains on the second single-crystal semiconductor layer 102, or the crack may be created so that the ion layer 103 partially remains on each of the first single-crystal semiconductor layer 101 and the second single-crystal semiconductor layer 102.

The heat treatment is preferably performed at a temperature higher than the film formation temperature of the bond layer 104, and lower than the upper temperature limit of the base substrate 100. For example, in the case where a low-thermostable glass substrate is used as the base substrate 100, heat treatment at 400° C. to 600° C. is preferable.

The second single-crystal semiconductor layer 102 which remains over the base substrate 100 as described above is the separate single-crystal semiconductor layer.

Embodiment Mode 4

In this embodiment mode, a method for forming a first region including a separate single-crystal semiconductor layer and a second region including a non-single-crystal semiconductor layer will be described.

Figure 6A:
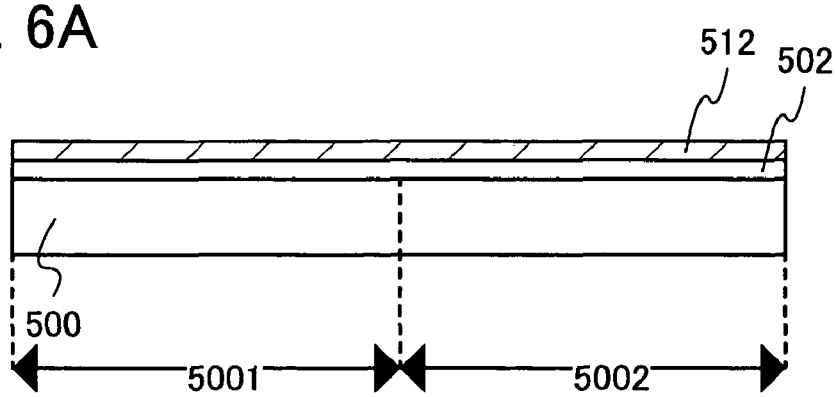
FIGS. 6A to 6C illustrate a method for manufacturing a semiconductor device.

First, a base film 502 and a non-single-crystal semiconductor layer 512 are formed over a substrate 500 (FIG. 6A).

As the substrate 500, a substrate selected from a variety of glass substrates that are used in the electronics industry is used, such as a substrate of aluminosilicate glass, aluminoborosilicate glass, or barium borosilicate glass. In addition, a substrate of quartz glass, a semiconductor substrate such as a silicon wafer, or the like can also be used.

Further, as the base film 502, a single layer of a silicon oxide film, a silicon nitride film, a silicon nitride oxide film, a silicon oxynitride film, or a resin film can be used, or a film laminate thereof can be used.

The base film 502 is preferably provided in the case where a glass substrate is used, in order to prevent contamination from the substrate.

A base layer that is preferred for a glass substrate is a base layer that is formed by stacking a silicon oxide film on a silicon nitride film or a silicon nitride oxide film which is formed over the substrate.

A silicon nitride film or a silicon nitride oxide film has an excellent blocking property, and prevents contamination from the substrate. However, if a channel formation region is formed in contact with a silicon nitride film, a trap level is formed and operation of a TFT is adversely affected. Therefore, it is preferable to provide a silicon oxide film as a buffer between the non-single-crystal semiconductor layer 512 and the silicon nitride film.

Further, for the non-single-crystal semiconductor layer 512, an amorphous semiconductor, a microcrystalline semiconductor, or a polycrystalline semiconductor is used. As a material, silicon, silicon germanium, gallium arsenide, or the like is used. As a formation method, a CVD method, a sputtering method, or the like can be used. The film thickness is 5 nm to 500 nm, preferably 10 nm to 200 nm.

Note that the thickness of the non-single-crystal semiconductor layer is preferably thinner than that of the separate single-crystal semiconductor layer. This is because yield of separation is increased when the thickness of the separate single-crystal semiconductor layer is large, and the non-single-crystal semiconductor has better characteristics when it is thin.

Figure 6B:
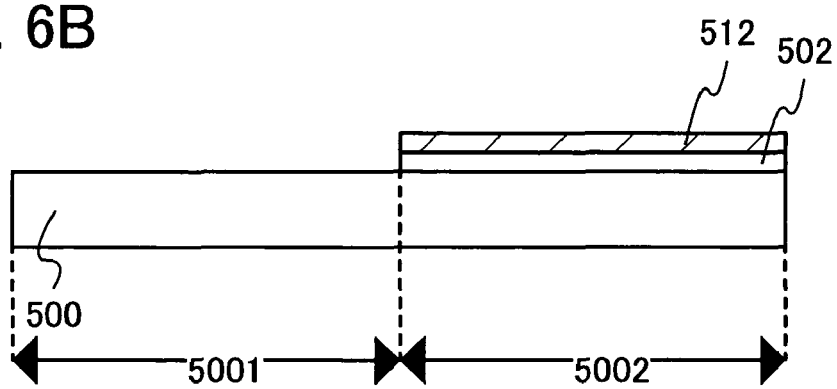

Next, the non-single-crystal semiconductor layer 512 and the base film 502 which are formed in a first region 5001 are removed, and thereby the non-single-crystal semiconductor layer 512 and the base film 502 are left only in a second region 5002 (FIG. 6B).

As the removal method, wet etching is preferable to maintain flatness of the substrate 500.

Figure 6C:
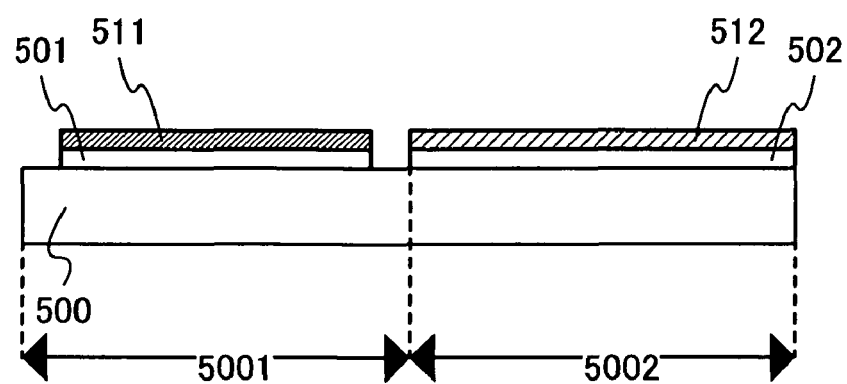

Next, using the method in Embodiment Mode 3, an insulating film 501 and a separate single-crystal semiconductor layer 511 are formed over the substrate in the first region 5001 (FIG. 6C).

At this time, hydrogen in the non-single-crystal semiconductor layer can be released by a heat treatment at 400° C. to 600° C. for separation.

Note that releasing of hydrogen makes it possible to prevent ablation of the non-single-crystal semiconductor layer during laser irradiation.

A surface of the insulating film 501, which is in contact with a substrate surface is flat. Further, another insulating film may be provided between the insulating film 501 and the separate single-crystal semiconductor layer 511.

The other insulating film preferably includes a silicon oxide film that is in contact with the separate single-crystal semiconductor layer 511 and a silicon nitride film or a silicon nitride oxide film which is in contact with the silicon oxide film.

Here, since the separate single-crystal semiconductor layer 511 is damaged by ion implantation or ion doping, the damage needs to be repaired.

On the other hand, the non-single-crystal semiconductor layer 512 (particularly in a case where an amorphous semiconductor layer is used) does not have sufficient crystallinity when it is only formed; therefore, crystallization is necessary.

Damage repair and crystallization are preferably performed by laser irradiation.

However, there is an optimal value for the value of the energy of laser light.

If energy is less than this optimal value, damage repair and crystallization are not performed sufficiently. If energy is more than this optimal value, the semiconductor may be ablated or may be microcrystallized.

Further, this optimal value changes depending on thickness and properties of a film. For example, in the case of using silicon, the optimal value is 350 mJ/cm$^2$ to 450 mJ/cm$^2$ when the thickness of a semiconductor layer is 50 nm, and 600 mJ/cm$^2$ to 700 mJ/cm$^2$ when the thickness of the semiconductor layer is 100 nm.

Figure 7A:
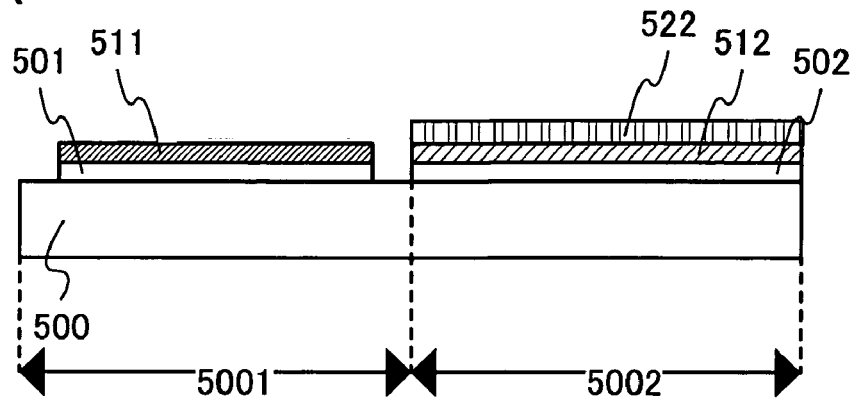
FIGS. 7A to 7C illustrate a method for manufacturing a semiconductor device.

Next, a cap film is provided over either the separate single-crystal semiconductor layer 511 or the non-single-crystal semiconductor layer 512. Here, a cap film 522 is provided over the non-single-crystal semiconductor layer 512 formed in the second region 5002 (FIG. 7A).

As the cap film, a single layer of a silicon oxide film, a silicon nitride film, a silicon nitride oxide film, or a silicon oxynitride film can be used, or a film laminate thereof can be used.

The cap film is provided to change an absorptance of a laser beam, by changing a light path length of the laser light.

Here, the light path length is (n s), which is calculated by multiplying a geometric length (s) that light travels and a refractive index (n) of a medium through which the light travels.

The optical path length of a laser beam can be changed freely by suitably selecting the material of the cap film to control the refractive index (n) and by changing the thickness of the cap film to control the geometric length (s) of regions having different refractive indices.

By varying the light path length, regions with different optimal values of energy density of a laser beam can be irradiated with laser light all at once.

The film thickness can be determined appropriately depending on the relationship between the wavelength of the laser light and the refractive index of the cap film.

The wavelength of a laser beam depends on the type of a laser. For example, an excimer laser can emit a laser beam with a wavelength of 193 nm, 248 nm, 308 nm, 351 nm, or the like, and a YAG laser can emit a laser beam with a wavelength of 266 nm, 355 nm, 532 nm, 1064 nm, or the like. Note that the type of a laser is not limited to the above.

Further, the refractive index of the cap film depends on the composition of the film. For example, according to a measurement result obtained by the present inventor using a spectroscopic ellipsometer (manufactured by HORIBA JOBIN YVON), the refractive index of a silicon nitride oxide film formed by CVD was 1.75 to 2.0; a silicon oxynitride film formed by CVD was 1.45 to 1.55; and a silicon nitride film formed by sputtering was 2.0 to 2.3.

However, the refractive index may change to some extent depending on film formation conditions. Therefore, it is preferable to form a test film that is used as the cap film, and to perform the measurement using a spectroscopic ellipsometer or the like.

Figure 7B:
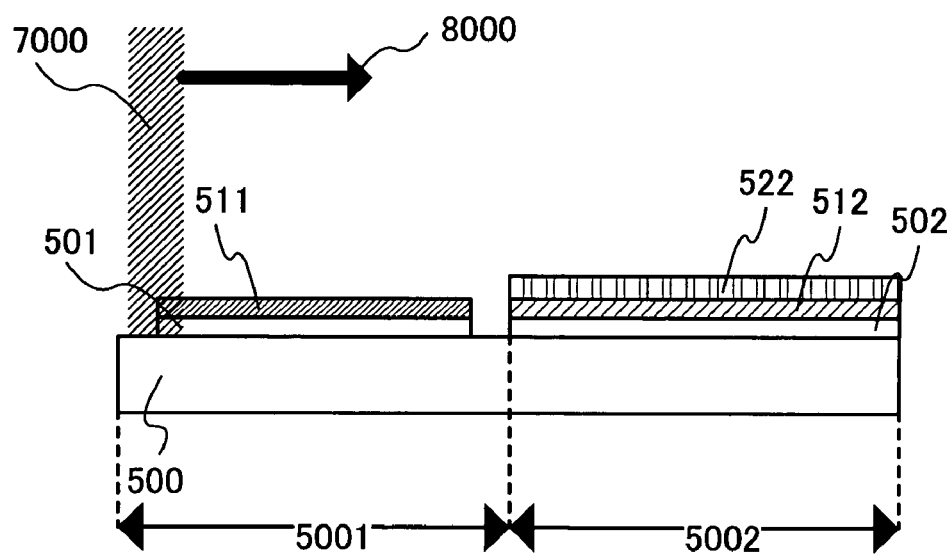

Next, a linear laser beam 7000 is scanned in a direction of an arrow 8000, and the separate single-crystal semiconductor layer 511 and the non-single-crystal semiconductor layer 512 are irradiated with the linear laser beam 7000 all at once (FIG. 7B).

Note that laser irradiation may be performed all at once by scanning a spot laser beam back and forth.

Figure 7C:
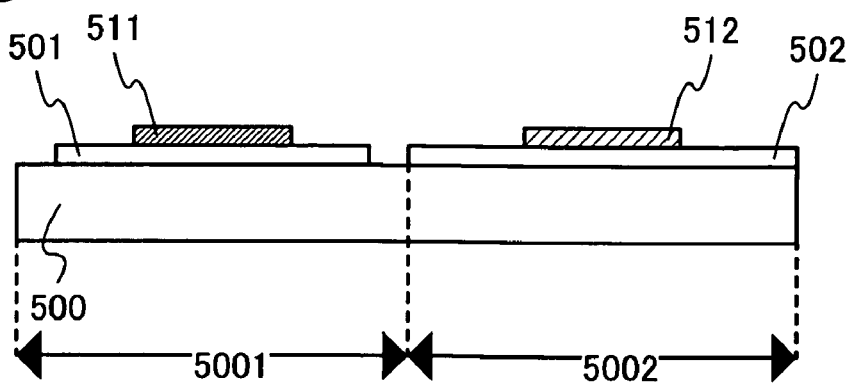

Next, after the cap film is removed, the separate single-crystal semiconductor layer 511 and the non-single-crystal semiconductor layer 512 are each etched and processed into an island shape (FIG. 7C). The laser irradiation may be performed after the semiconductor layers are processed into an island shape.

Figure 8A:
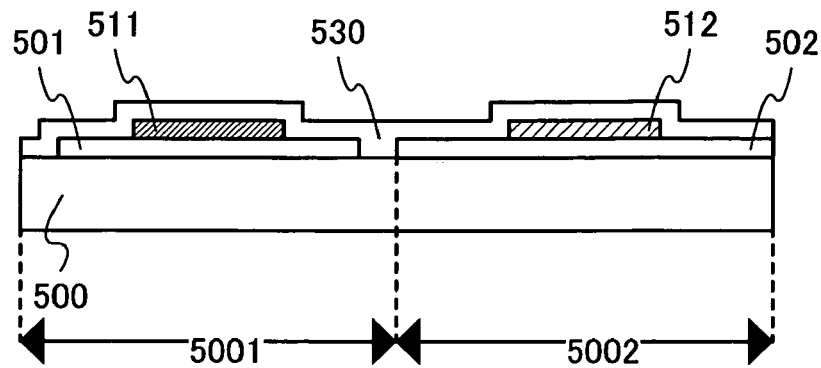
FIGS. 8A to 8C illustrate a method for manufacturing a semiconductor device.

Next, a gate insulating film 530 is formed over the separate single-crystal semiconductor layer 511 and the non-single-crystal semiconductor layer 512 (FIG. 8A).

The gate insulating film 530 can be formed with a silicon nitride film, a silicon oxide film, a silicon nitride oxide film, a silicon oxynitride film, or the like.

As a formation method of the gate insulating film 530, a CVD method, a sputtering method, or the like can be used. The gate insulating film may have a layered structure. The film thickness is preferably small, as less than or equal to 200 nm. In a case of thinning the thickness of the channel formation region, the thickness of the gate insulating film is preferably less than or equal to 50 nm, and more preferably less than or equal to 20 nm.

Figure 8B:
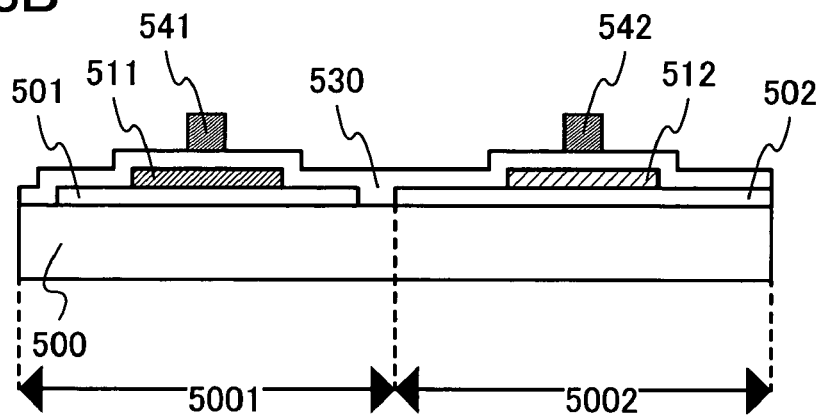

Then, a gate electrode 541 and a gate electrode 542 are formed over the gate insulating film 530 (FIG. 8B).

For each of the gate electrodes, a conductive film that is a single layer of W, Ta, Mo, Cr, Cu, Nd, Al, Al—Nd, Al—Si, Al—Ti, or the like, or a laminate thereof, is formed by a sputtering method or the like. Alternatively, an n-type or p-type silicon may be used. The film thickness is preferably 50 nm to 500 nm.

Next, an impurity region is formed by adding an impurity imparting conductivity.

The impurity is added to at least a source region and a drain region. A low concentration impurity region may be provided as necessary.

For the impurity imparting conductivity, phosphorus, arsenic, or the like can be used as an n-type impurity, and boron can be used as a p-type impurity. The impurity can be added by a method such as ion doping, ion implantation, laser doping, or a thermal diffusion method.

Further, although description is made using an example of only one element for the sake convenience in this embodiment mode, a CMOS circuit that has a plurality of elements formed over the substrate and has both an n-type TFT and a p-type TFT is preferable.

In a case of forming a CMOS circuit, an n-type impurity and a p-type impurity may be added in different steps using a resist mask.

Figure 8C:
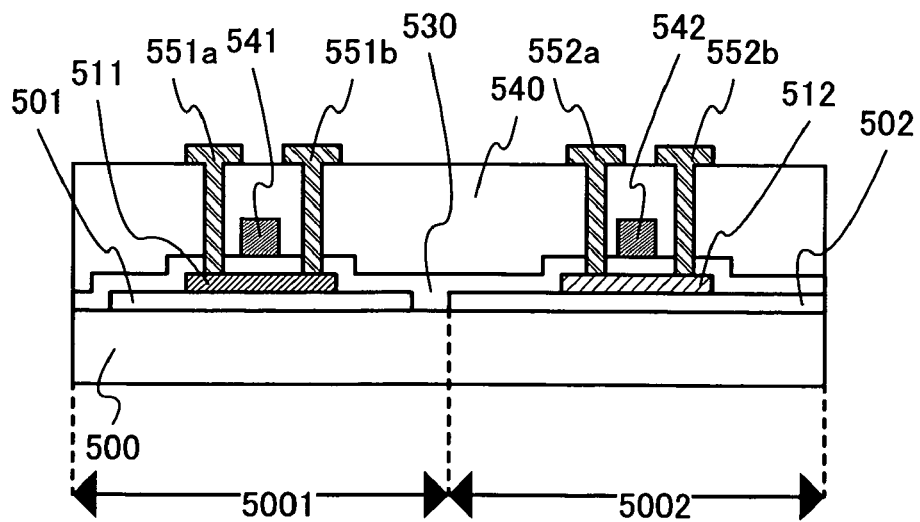

Next, an interlayer insulating film 540 is formed over the separate single-crystal semiconductor layer 511, the non-single-crystal semiconductor layer 512, the gate insulating film 530, the gate electrode 541, and the gate electrode 542. After that, contact holes are formed in the interlayer insulating film 540, and a wiring 551a, a wiring 551b, a wiring 552a and a wiring 552b are formed (FIG. 8C).

As the interlayer insulating film 540, a silicon nitride film, a silicon oxide film, a silicon nitride oxide film, a silicon oxynitride film, or the like can be used. Alternatively, an organic resin film of acrylic, polyimide, a siloxane polymer, or the like can be used. The interlayer insulating film may be a single layer or a laminate. The film thickness is preferably more than the height of the gate electrode 541.

Further, before or after forming the interlayer insulating film 540, heat treatment for activating the impurity elements may be performed.

For each of the wirings 551a, 551b, 552a, and 552b, a conductive film of a single layer of Mo, Cr, Cu, Nd, Al, Al—Nd, Al—Si, Al—Ti, or the like, or stacked layers thereof, is used. A thickness is preferably 100 nm to 3 μm.

Further, in the case where a display device is manufactured, a pixel electrode that is connected to any of the wirings 551a, 551b, 552a, and 552b is formed.

After that, a display element is formed.

For example, in the case of forming a liquid crystal display device, a counter substrate over which a counter electrode, a color filter, and the like are formed, is prepared. After that, an alignment film is formed over each of the counter substrate and a substrate provided with a TFT. Subsequently, the counter substrate and the substrate provided with a TFT are attached together using a sealing material, and then liquid crystal is injected between the substrate provided with a TFT and the counter substrate. In this case, a portion where the pixel electrode, liquid crystal, and the counter electrode overlap is the display element.

For example, in the case of forming an EL display device, a layer including a light emitting layer is formed over the pixel electrode, and an electrode is formed over the layer including a light emitting layer. After that, a counter substrate is prepared. Then, the counter substrate and the substrate provided with a TFT are attached together using a sealing material. In this case, a portion where the pixel electrode and the layer including the light emitting layer overlap is the display element.

Further, a multilayer wiring in which a plurality of interlayer insulating films and wirings are stacked may be formed as appropriate to suit the design of a circuit.

Embodiment Mode 5

In this embodiment mode, a method for forming a first region including a separate single-crystal semiconductor layer and a second region including a non-single-crystal semiconductor layer will be described.

Figure 9A:
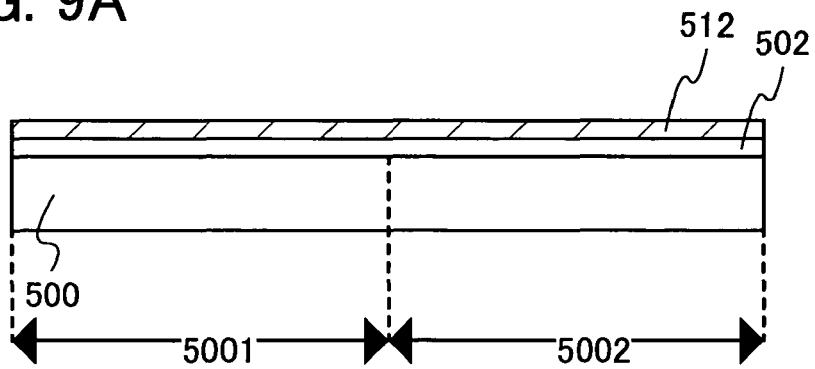
FIGS. 9A to 9C illustrate a method for manufacturing a semiconductor device.

First, a base film 502 and a non-single-crystal semiconductor layer 512 are formed over a substrate 500 (FIG. 9A).

Figure 9B:
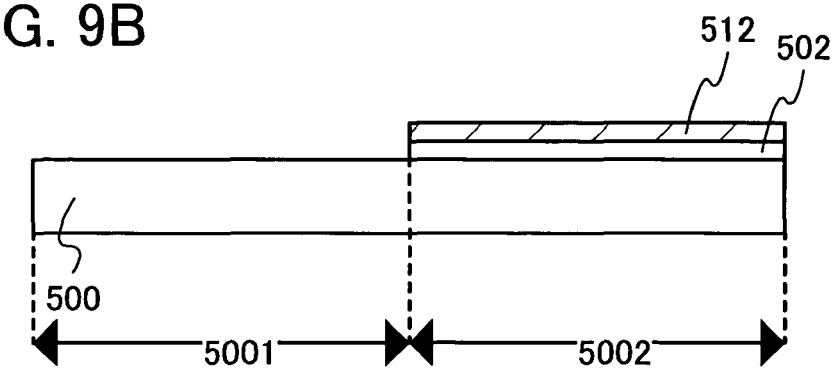

Next, the non-single-crystal semiconductor layer 512 and the base film 502 which are formed in a first region 5001 are removed, and thereby the non-single-crystal semiconductor layer 512 and the base film 502 are left only in a second region 5002 (FIG. 9B).

Figure 9C:
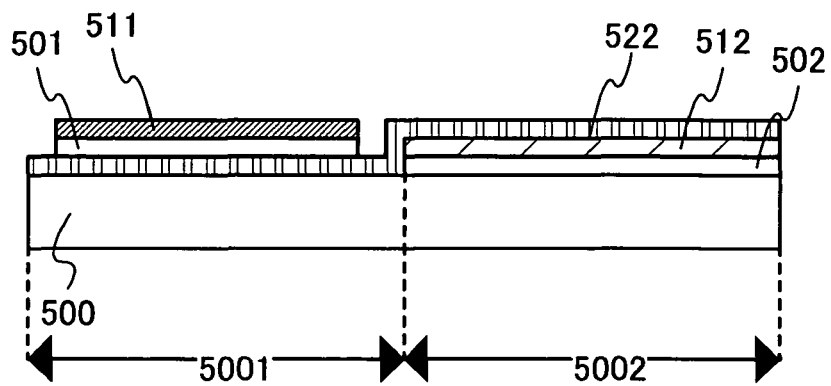

Next, a cap film 522 is formed over the first region 5001 and the second region 5002, and the separate single-crystal semiconductor layer 511 is attached to the first region 5001 by the method shown in Embodiment Mode 3 (FIG. 9C).

Here, when a silicon oxide film (an organosilane film) formed by chemical vapor deposition using an organosilane gas is used as the cap film 522, the cap film 522 can have a function of a bond layer; thus, the substrate 500 and the separate single-crystal semiconductor layer 511 can be bonded to each other more firmly. Further, the cap film 522 is used as both a bond layer and a cap film. Therefore, the number of process steps can be reduced.

At this time, hydrogen in the non-single-crystal semiconductor layer can be released by a heat treatment at 400° C. to 600° C. for separation.

Note that releasing of hydrogen makes it possible to prevent ablation of the non-single-crystal semiconductor layer during laser irradiation.

Figure 10:
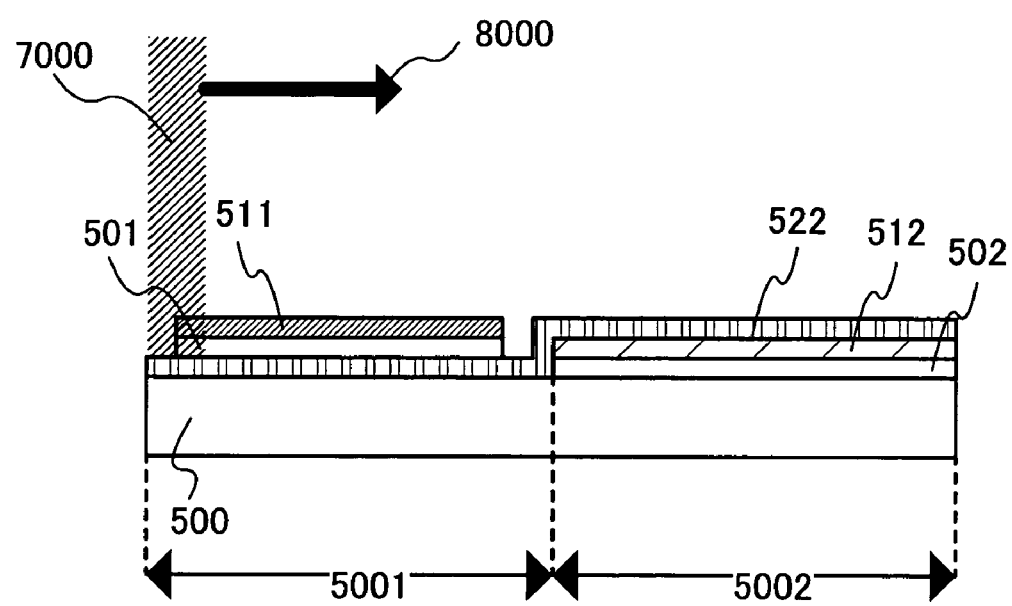
FIG. 10 illustrates a method for manufacturing a semiconductor device.

Next, a linear laser beam 7000 is scanned in a direction of an arrow 8000, and the separate single-crystal semiconductor layer 511 and the non-single-crystal semiconductor layer 512 are irradiated with the linear laser beam 7000 all at once (FIG. 10).

Note that laser irradiation may be performed all at once by scanning a spot laser beam back and forth.

Next, as in Embodiment Mode 4, after the cap film is removed, the separate single-crystal semiconductor layer 511 and the non-single-crystal semiconductor layer 512 are each etched and processed into an island shape; a gate insulating film and a gate electrode are formed; an impurity is added to the semiconductor layer; and an interlayer insulating film and wirings are formed.

Further, in the case where a display device is manufactured, a pixel electrode that is connected to any of the wirings is formed.

After that, a display element is formed.

For example, in the case of forming a liquid crystal display device, a counter substrate over which a counter electrode, a color filter, and the like are formed, is prepared. After that, an alignment film is formed over each of the counter substrate and a substrate provided with a TFT. Subsequently, the counter substrate and the substrate provided with a TFT are attached together using a sealing material, and then liquid crystal is injected between the substrate provided with a TFT and the counter substrate. In this case, a portion where the pixel electrode, liquid crystal, and the counter electrode overlap is the display element.

For example, in the case of forming an EL display device, a layer including a light emitting layer is formed over the pixel electrode, and an electrode is formed over the layer including a light emitting layer. After that, a counter substrate is prepared. Then, the counter substrate and the substrate provided with a TFT are attached together using a sealing material. In this case, a portion where the pixel electrode and the layer including the light emitting layer overlap is the display element.

Further, a multilayer wiring in which a plurality of interlayer insulating films and wirings are stacked may be formed as appropriate to suit the design of a circuit.

As in this embodiment mode, when an organosilane film is used as both a cap film and a bonding surface, the number of process steps can be reduced as compared with Embodiment Mode 4.

Embodiment Mode 6

In this embodiment mode, a method for forming a first region including a separate single-crystal semiconductor layer and a second region including a non-single-crystal semiconductor layer will be described.

Figure 11A:
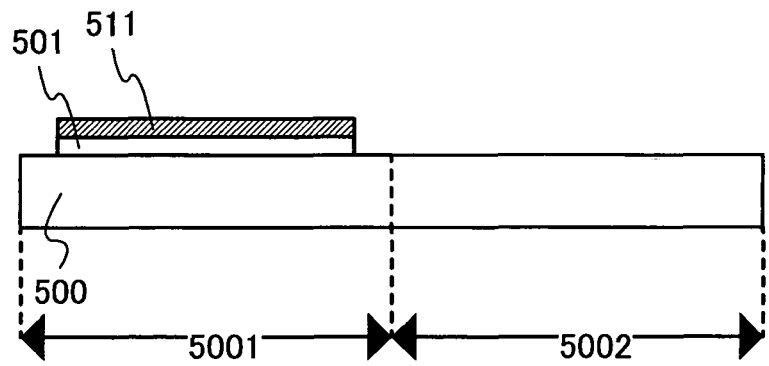
FIGS. 11A to 11C illustrate a method for manufacturing a semiconductor device.

First, the separate single-crystal semiconductor layer 511 is attached to the substrate 500 in the first region 5001 by the method shown in Embodiment Mode 3 (FIG. 11A).

Figure 11B:
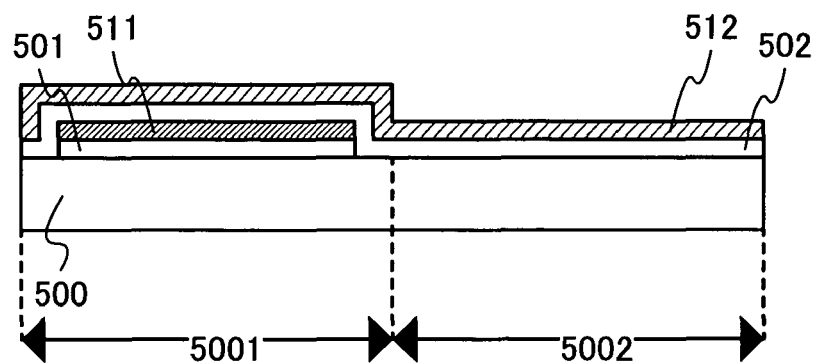

Then, the base film 502 (cap film, etching stopper film) and the non-single-crystal semiconductor layer 512 are formed in the first region 5001 and the second region 5002 (FIG. 11B).

Figure 11C:
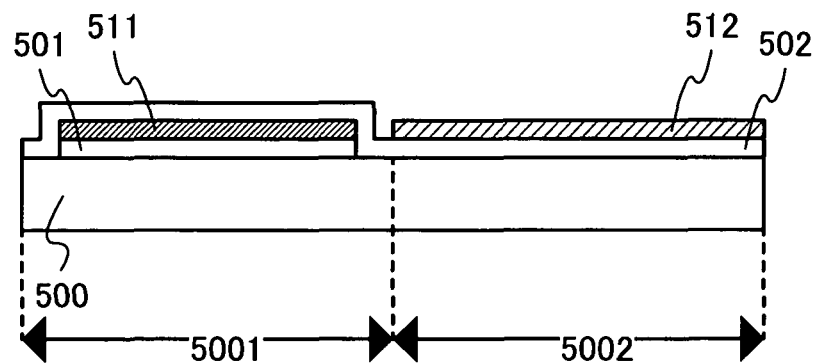

Next, the non-single-crystal semiconductor layer 512 formed in the first region 5001 is removed using the base film 502 as an etching stopper film (FIG. 11C).

Figure 12:
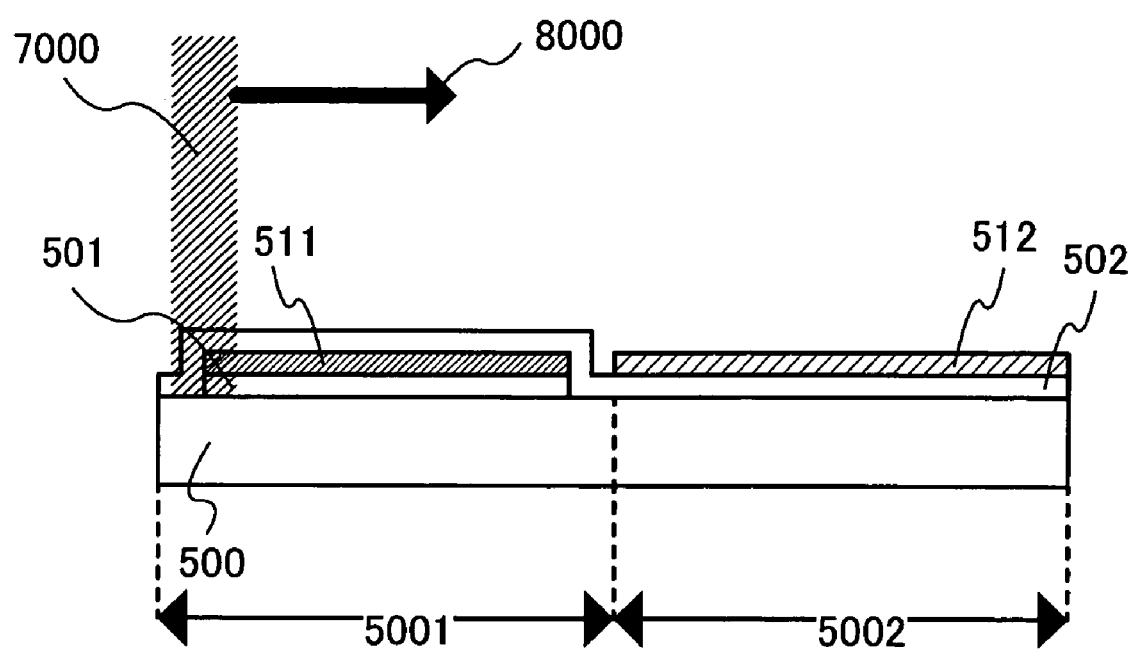
FIG. 12 illustrates a method for manufacturing a semiconductor device.

The separate single-crystal semiconductor layer 511 and the non-single-crystal semiconductor layer 512 are irradiated with the linear laser beam 7000 all at once scanned in the direction of the arrow 8000 using the base film 502 as a cap film (FIG. 12).

As described above, the base film 502 functions as both an etching stopper film and a cap film in the first region, and serves as a base film in the second region. In other words, the base film 502 is a film serving as an etching stopper film, a cap film, and a base film. Therefore, the number of process steps can be reduced.

Note that laser irradiation may be performed all at once by scanning a spot laser beam back and forth.

It is preferable to perform heat treatment for releasing hydrogen before the laser irradiation, which prevents ablation.

Next, as in Embodiment Mode 4, after the cap film is removed, the separate single-crystal semiconductor layer 511 and the non-single-crystal semiconductor layer 512 are each etched and processed into an island shape; a gate insulating film and a gate electrode are formed; an n-type or p-type impurity is added to the semiconductor layer; and an interlayer insulating film and wirings are formed.

Further, in the case where a display device is manufactured, a pixel electrode that is connected to any of the wirings 551a, 551b, 552a, and 552b is formed.

After that, a display element is formed.

For example, in the case of forming a liquid crystal display device, a counter substrate over which a counter electrode, a color filter, and the like are formed, is prepared. After that, an alignment film is formed over each of the counter substrate and a substrate provided with a TFT. Subsequently, the counter substrate and the substrate provided with a TFT are attached together using a sealing material, and then liquid crystal is injected between the substrate provided with a TFT and the counter substrate. In this case, a portion where the pixel electrode, liquid crystal, and the counter electrode overlap is the display element.

For example, in the case of forming an EL display device, a layer including a light emitting layer is formed over the pixel electrode, and an electrode is formed over the layer including a light emitting layer. After that, a counter substrate is prepared. Then, the counter substrate and the substrate provided with a TFT are attached together using a sealing material. In this case, a portion where the pixel electrode and the layer including the light emitting layer overlap is the display element.

Further, a multilayer wiring in which a plurality of interlayer insulating films and wirings are stacked may be formed as appropriate to suit the design of a circuit.

As in this embodiment mode, when an organosilane film is used as both a cap film and a base film, the number of process steps can be reduced as compared with Embodiment Mode 4.

Embodiment Mode 7

In Embodiment Modes 4 to 6, the structure in which a cap film is provided only over either a separate single-crystal semiconductor layer or a non-single-crystal semiconductor layer has been described; however, cap films having different absorptance may be provided over the first region 5001 and the second region 5002.

Figure 13A:
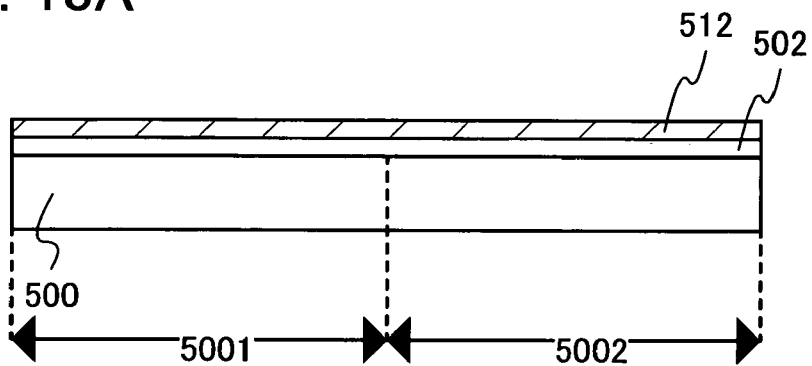
FIGS. 13A to 13C illustrate a method for manufacturing a semiconductor device.

For example, the base film 502 and the non-single-crystal semiconductor layer 512 are formed over the substrate 500 (FIG. 13A).

Figure 13B:
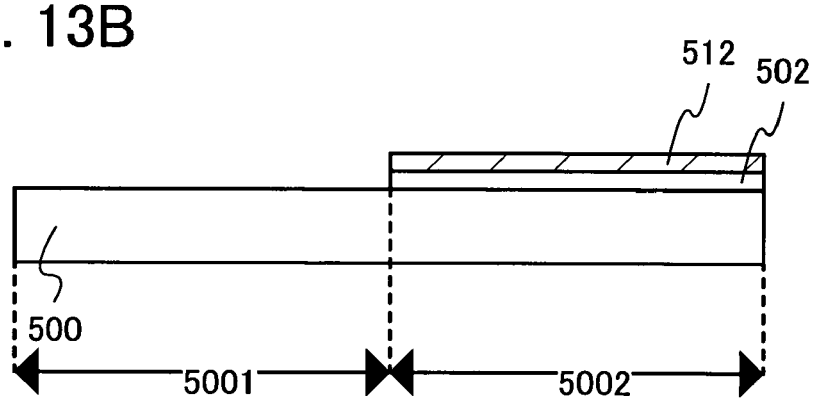

Then, the non-single-crystal semiconductor layer 512 and the base film 502 which are formed in the first region 5001 are removed, and thereby the non-single-crystal semiconductor layer 512 and the base film 502 are left only in the second region 5002 (FIG. 13B).

Figure 13C:
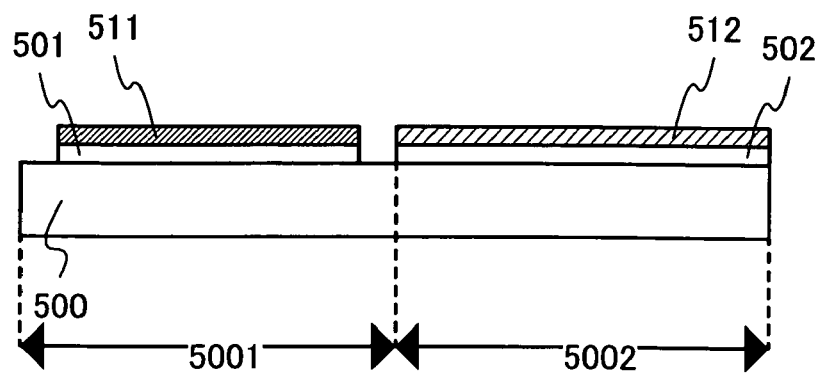

Next, the separate single-crystal semiconductor layer 511 is attached to the first region 5001 by the method shown in Embodiment Mode 3 (FIG. 13C).

Figure 14A:
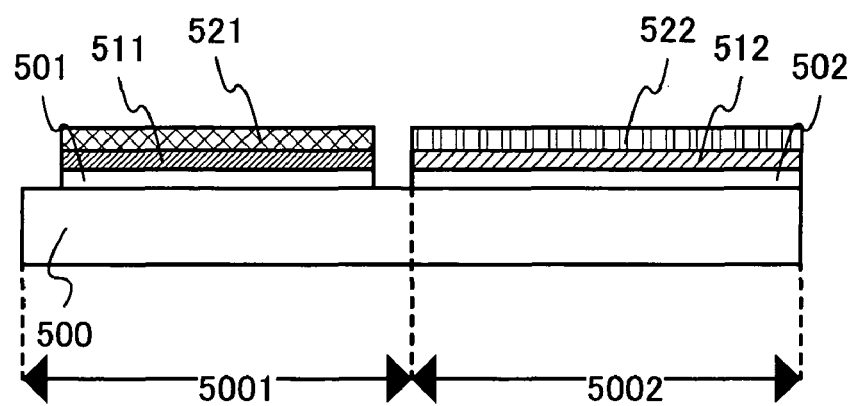
FIGS. 14A and 14B illustrate a method for manufacturing a semiconductor device.

Subsequently, a first cap film 521 is formed in the first region 5001, and a second cap film 522 is formed in the second region 5002 (FIG. 14A).

The absorptance of the first cap film 521 is different from that of the second cap film 522.

In order to obtain different absorptances, the thickness of the first cap film 521 is varied from the thickness of the second cap film 522. Alternatively, the first cap film 521 is formed from a different material from the second cap film 522. Further, the thickness of the first cap film 521 may be different from that of the second cap film 522, and the material of the first cap film 521 may also be different from that of the second cap film 522.

Note that it is preferable to employ a method in which after cap films formed of the same material are formed in the first region 5001 and the second region 5002, either the first region 5001 or the second region 5002 is etched, thereby the thickness of the first cap film 521 is made different from that of the second cap film 522, which is simple.

Figure 14B:
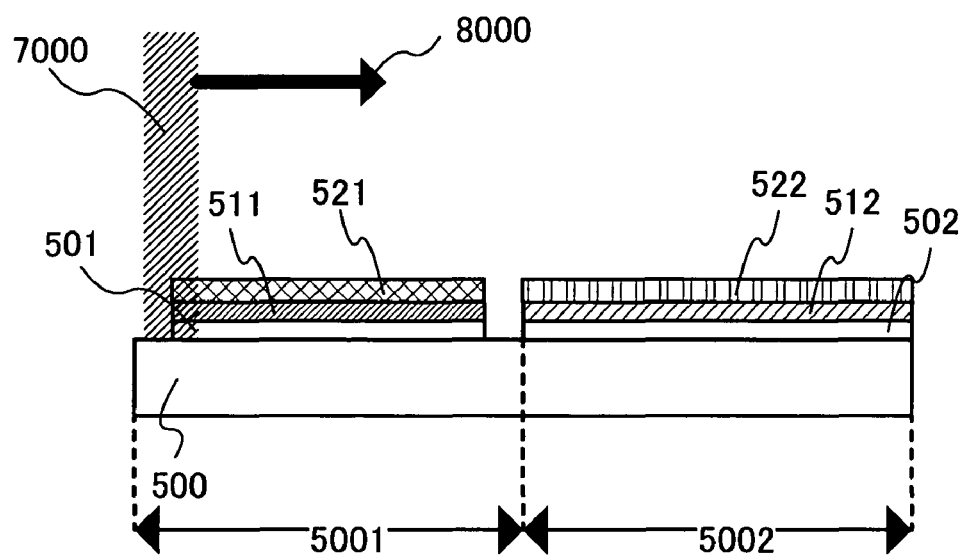

Next, a linear laser beam 7000 is scanned in a direction of an arrow 8000, and the separate single-crystal semiconductor layer 511 and the non-single-crystal semiconductor layer 512 are irradiated with the linear laser beam 7000 all at once (FIG. 14B).

Next, as in Embodiment Mode 4, after the cap film is removed, the separate single-crystal semiconductor layer 511 and the non-single-crystal semiconductor layer 512 are each etched and processed into an island shape; a gate insulating film and a gate electrode are formed; an impurity is added to the semiconductor layer; and an interlayer insulating film and wirings are formed.

Further, in the case where a display device is manufactured, a pixel electrode that is connected to any of the wirings is formed.

After that, a display element is formed.

For example, in the case of forming a liquid crystal display device, a counter substrate over which a counter electrode, a color filter, and the like are formed, is prepared. After that, an alignment film is formed over each of the counter substrate and a substrate provided with a TFT. Subsequently, the counter substrate and the substrate provided with a TFT are attached together using a sealing material, and then liquid crystal is injected between the substrate provided with a TFT and the counter substrate. In this case, a portion where the pixel electrode, liquid crystal, and the counter electrode overlap is the display element.

For example, in the case of forming an EL display device, a layer including a light emitting layer is formed over the pixel electrode, and an electrode is formed over the layer including a light emitting layer. After that, a counter substrate is prepared. Then, the counter substrate and the substrate provided with a TFT are attached together using a sealing material. In this case, a portion where the pixel electrode and the layer including the light emitting layer overlap is the display element.

Further, a multilayer wiring in which a plurality of interlayer insulating films and wirings are stacked may be formed as appropriate to suit the design of a circuit.

Embodiment Mode 8

In this embodiment mode, surface flatness of a separate single-crystal semiconductor layer and a non-single-crystal semiconductor layer, and characteristics of devices using the separate single-crystal semiconductor layer and the non-single-crystal semiconductor layer will be described.

First, Tables 1 and 2 illustrate flatness of surfaces of the separate single-crystal semiconductor layer and the non-single-crystal semiconductor layer before and after laser irradiation. Regarding Table 1, laser irradiation is performed without using a cap film and flatness before and after the laser irradiation is compared. Regarding Table 2, laser irradiation is performed after forming a cap film, and flatness before and after the laser irradiation is compared.

TABLE 1

Comparison of flatness (without using a cap film)

|  | Non-single-crystal semiconductor layer | Separate single-crystal semiconductor layer |
|---|---|---|
| Before laser irradiation | ○ | x |
| After laser irradiation (atmosphere) | x | x |
| After laser irradiation (inert atmosphere) | ○ | ○ | x: flatness is not good
○: flatness is good

TABLE 2

Comparison of flatness (using a cap film)

|  | Non-single-crystal semiconductor layer | Separate single-crystal semiconductor layer |
|---|---|---|
| Before laser irradiation | ○ | x |
| After laser irradiation (atmosphere) | ○ | x |
| After laser irradiation (inert atmosphere) | ○ | x | x: flatness is not good
○: flatness is good

Since the separate single-crystal semiconductor layer is obtained by a method in which separation is caused by creating a crack; therefore, irregularities are formed on the surface and the flatness is not good.

On the other hand, the non-single-crystal semiconductor layer is formed without using the method in which separation is caused by creating a crack; therefore, the non-single-crystal semiconductor layer has less irregularities on the surface as compared with the separate single-crystal semiconductor layer and the flatness is good.

Further, in the case where laser irradiation is performed without using a cap film, laser beam irradiation in the atmosphere makes both the separate single-crystal semiconductor layer and the non-single-crystal semiconductor layer have poor flatness.

On the other hand, also in the case where laser irradiation is performed without using a cap film, laser beam irradiation in an inert atmosphere makes both the separate single-crystal semiconductor layer and the non-single-crystal semiconductor layer have good flatness.

An inert atmosphere is an atmosphere in which oxygen concentration is low, for example, a nitrogen atmosphere, a noble gas atmosphere, or the like.

This is because ridges are easily formed on a semiconductor surface when it is irradiated with a laser beam in the atmosphere, due to the effect of oxygen.

Further, when irradiation with a laser beam is performed using a cap film, the flatness is not greatly changed by the laser irradiation either in the atmosphere or in an inert atmosphere.

Tables 3 and 4 illustrate the crystallinity of the separate single-crystal semiconductor layer and the non-single-crystal semiconductor layer before and after laser irradiation. Regarding Tables 3 and 4, transistors are formed with or without laser irradiation in different atmospheres, and device characteristics are compared. In the case of Table 3, laser irradiation is performed without a cap film while laser irradiation is performed using a cap film in the case of Table 4.

TABLE 3

Comparison of device characteristics (without using a cap film)

|  | Non-single-crystal semiconductor layer | Separate single-crystal semiconductor layer |
| --- | --- | --- |
| Before laser irradiation | 1 | 4 |
| After laser irradiation (atmosphere) | 3 | 5 |
| After laser irradiation (inert atmosphere) | 2 | 5 |

*relative evaluation: larger the value, better the characteristic

TABLE 4

Comparison of device characteristics (using a cap film)

|  | Non-single-crystal semiconductor layer | Separate single-crystal semiconductor layer |
| --- | --- | --- |
| Before laser irradiation | 1 | 4 |
| After laser irradiation (atmosphere) | 2 | 5 |
| After laser irradiation (inert atmosphere) | 2 | 5 |

*relative evaluation: larger the value, better the characteristic

The device using the separate single-crystal semiconductor layer has better device characteristics as compared with a device using the non-single-crystal semiconductor layer.

Further, in the case of performing laser irradiation without using a cap film, the device characteristics are improved.

Further, laser irradiation in the atmosphere makes oxygen contained in the atmosphere enters the semiconductor layer, so that a large number of dangling bonds created in forming the non-single-crystal semiconductor layer are reduced; thus, device characteristics of a device using the non-single-crystal semiconductor layer are enhanced.

Note that dangling bonds in the separate single-crystal semiconductor layer are few, oxygen contained in the atmosphere in which laser irradiation is performed does not greatly affect the device characteristics.

On the other hand, in the case where laser irradiation is performed using a cap film, the surface of the semiconductor is not bare, so that oxygen contained in the atmosphere in which laser irradiation is performed does not greatly affect the device characteristics.

From the above, it is preferable to perform laser irradiation using a cap film provided over the non-single-crystal semiconductor layer in an inert atmosphere, because flatness and crystallinity of the non-single-crystal semiconductor layer and flatness and device characteristics of the separate single-crystal semiconductor layer become favorable.

Further, in order to achieve the highest device characteristics of a device using a non-single-crystal semiconductor layer, it is preferable that a cap film is not provided over the non-single-crystal semiconductor layer and irradiation with a laser beam is performed in the atmosphere.

Embodiment Mode 9

In this embodiment mode, a laser irradiation test substrate will be described.

Energy of a laser beam is very unstable, and even when laser beams are applied under the same settings using the same apparatus, energy of the laser beams varies every time due to apparatus condition.

Accordingly, a test substrate formed of the same material and with the same thickness as the layer to be irradiated with a laser beam is prepared. Incidentally, when a sample substrate and a laser irradiation test substrate are formed using a manufacturing apparatus of a semiconductor one, it is generally very difficult to form the sample substrate and the laser irradiation test substrate which have exactly the same thickness of the semiconductor layer. Therefore, the term "the same" here may mean "almost the same". In other words, the laser irradiation test substrate may be formed using a material (film forming gas or a sputtering target) which is used for forming a layer which is the irradiation target so as to have a thickness approximating that of the layer. Accordingly, the laser irradiation test substrate is formed under the same settings using the same apparatus used for forming the layer which is the irradiation target.

Further, after irradiating the laser irradiation test substrate with a laser beam under a plurality of conditions, the plurality of the conditions are evaluated to determine the optimal condition (optimal crystallinity). Then, laser irradiation with a laser beam is performed under the optimal condition (optimal crystallinity).

For example, crystallinity is evaluated by analyzing an image of the laser irradiation test substrate, which is enlarged by a microscope image. Further, crystallinity may be evaluated by using a Raman spectrometer.

An example of a method of evaluating the optimal crystallinity will be described (naturally, the evaluation method is not limited to this example). For example, a plurality of sample substrates in each of which a semiconductor film is formed over a substrate is prepared. Then, the plurality of sample substrate is each irradiated with a laser beam having a different energy density. After that, the images of the plurality of semiconductor films or the results of the Raman spectroscopy are obtained. TFTs are manufactured using the plurality of semiconductor films. Values of electrical characteristics of the TFTs are obtained. Further, the values of the electrical characteristics are compared with the images or the results of the Raman spectroscopy. The comparison provides data indicating that a sample substrate with an image or the result of the Raman spectroscopy, which has the most favorable values of the electrical characteristics is the substrate having the optimal crystallinity. Once the data is obtained, crystallinity can be evaluated using the data at anytime thereafter.

Here, when the separate single-crystal semiconductor layer and the non-single-crystal semiconductor layer are irradiated with a laser beam, normally, it is necessary to prepare two laser irradiation test substrates of a separate single-crystal semiconductor layer and a non-single-crystal semiconductor layer.

However, in the case where either the separate single-crystal semiconductor layer or the non-single-crystal semiconductor layer is provided with a cap film and they are irradiated with a laser beam all at once, a laser irradiation test substrate of either the separate single-crystal semiconductor layer or the non-single-crystal semiconductor layer should be prepared.

Therefore, with the use of a cap film, the number of laser irradiation test substrates can be reduced, which can reduce cost.

In particular, since a separate single-crystal semiconductor layer is expensive as compared with a non-single-crystal semiconductor layer; therefore, it is preferable to use a non-single-crystal semiconductor layer as a laser irradiation test substrate.

Note that a laser irradiation test substrate is preferably processed under the same conditions as the substrate to be processed. Therefore, the laser irradiation test substrate of a semiconductor layer in a region provided with a cap film is preferably a semiconductor layer provided with a cap film on its surface.

Embodiment Mode 10

In this embodiment mode, examples of semiconductor devices of the present invention will be described.

The present invention can be applied to a pixel area, a driver circuit area, or the like of a display device provided with an organic light-emitting element, an inorganic light-emitting element, a liquid crystal display element, or the like.

Further, an electronic device provided with a memory medium, such as a digital camera, a car navigation system, a notebook computer, a game machine, a portable information terminal (e.g., a mobile telephone or a portable game machine), or a home game machine can be manufactured using the present invention.

Furthermore, the present invention can be applied to an integrated circuit such as a CPU (a central processing unit).

Figure 18A:
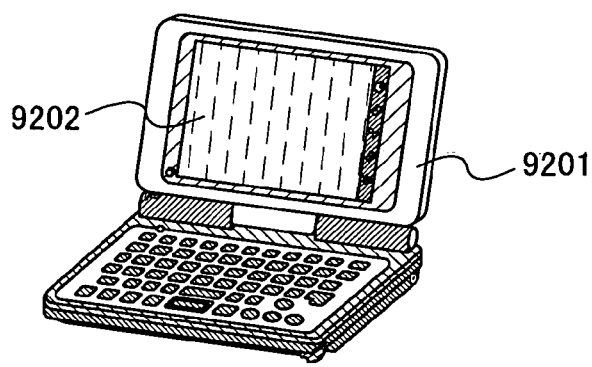
FIGS. 18A to 18E illustrate examples of semiconductor devices.
Figure 18B:
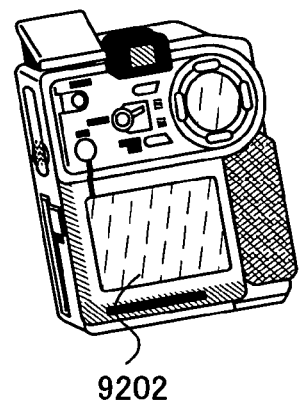
Figure 18C:
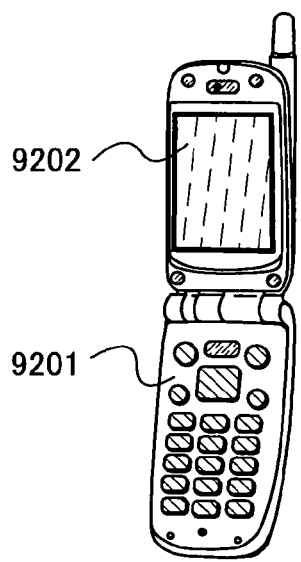
Figure 18D:
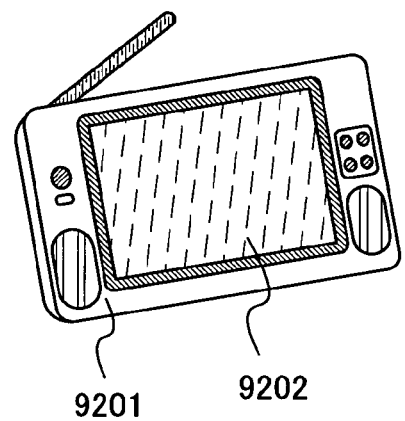
Figure 18E:
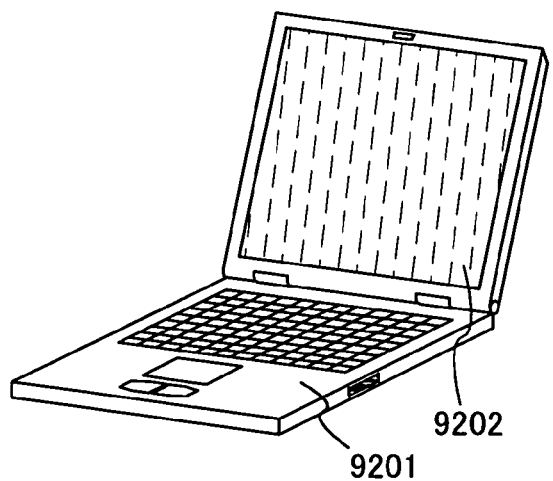

For example, FIG. 18A shows a personal information terminal. FIG. 18B shows a digital camera. FIG. 18C shows a mobile telephone. FIG. 18D shows a car navigation system. FIG. 18E shows a notebook computer. The present invention can be applied to an integrated circuit incorporated in a main body 9201 or a display portion 9202 of each of the devices.

Embodiment 1

Figure 15:
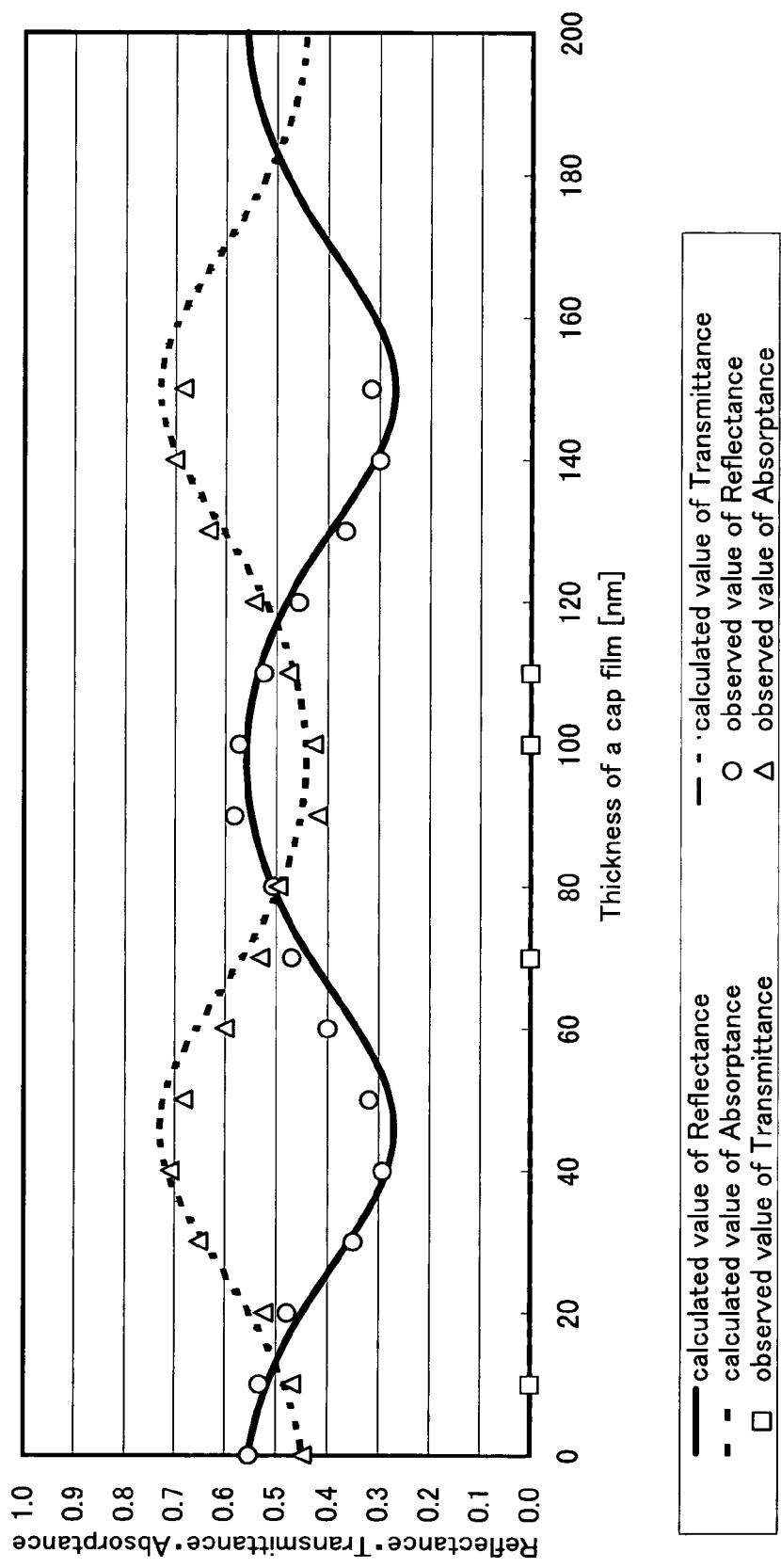
FIG. 15 illustrates reflectance, absorptance, and transmittance of an anti-reflective film.
Figure 16:
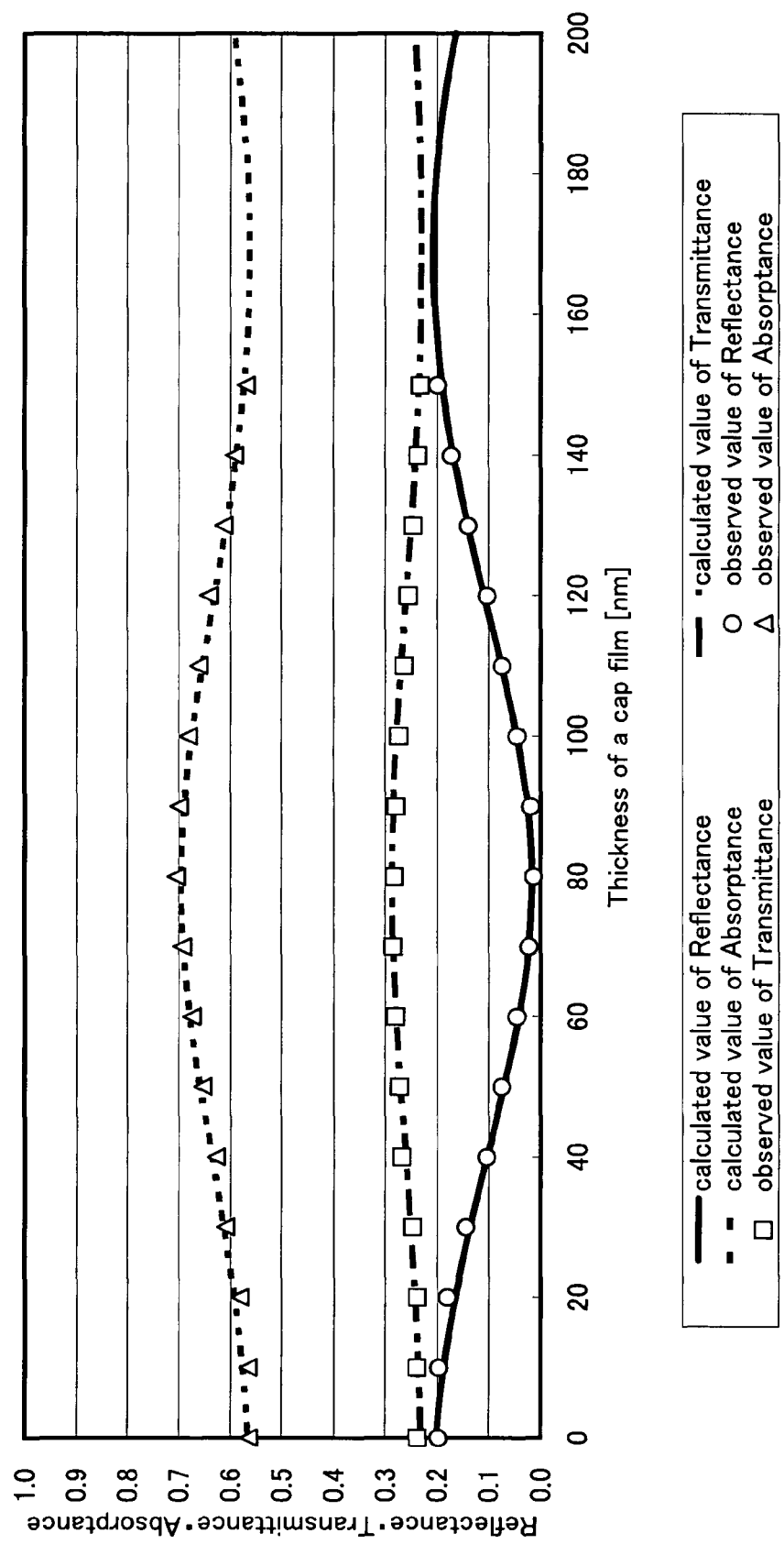
FIG. 16 illustrates reflectance, absorptance, and transmittance of an anti-reflective film.

FIG. 15 and FIG. 16 each illustrate the reflectance, the absorptance, and the transmittance of cap films with varying thickness, which are irradiated with laser beams having a wavelength of 308 nm and a wave length of 532 mm, respectively.

Each graph of FIG. 15 and FIG. 16 illustrates a plot of the dependency of the reflectance, absorptance, and transmittance on the thickness of a cap film in the case where a plurality of samples were prepared, in each of which a silicon nitride oxide film (thickness: 50 nm), a silicon oxynitride film (thickness: 100 nm), and an amorphous silicon film (thickness: 54 nm) were sequentially formed over a 1737 substrate (manufactured by Corning Inc.) by CVD, and a silicon oxynitride film having different thickness was formed as a cap film by CVD over the amorphous silicon film.

A spectrophotometer (U-4000 SPECTROPHOTOMETER manufactured by HITACHI) was used as a measurement device.

As shown in FIG. 15 and FIG. 16, the absorptance in a state where a cap film is formed as a single layer is higher as compared with the absorptance in a state where the film thickness is 0 nm, that is, a cap film is not formed.

Accordingly, when a cap film is formed as a single layer, the reflectance is low; therefore, the cap film can serve as an anti-reflective film.

Embodiment 2

Figure 17:
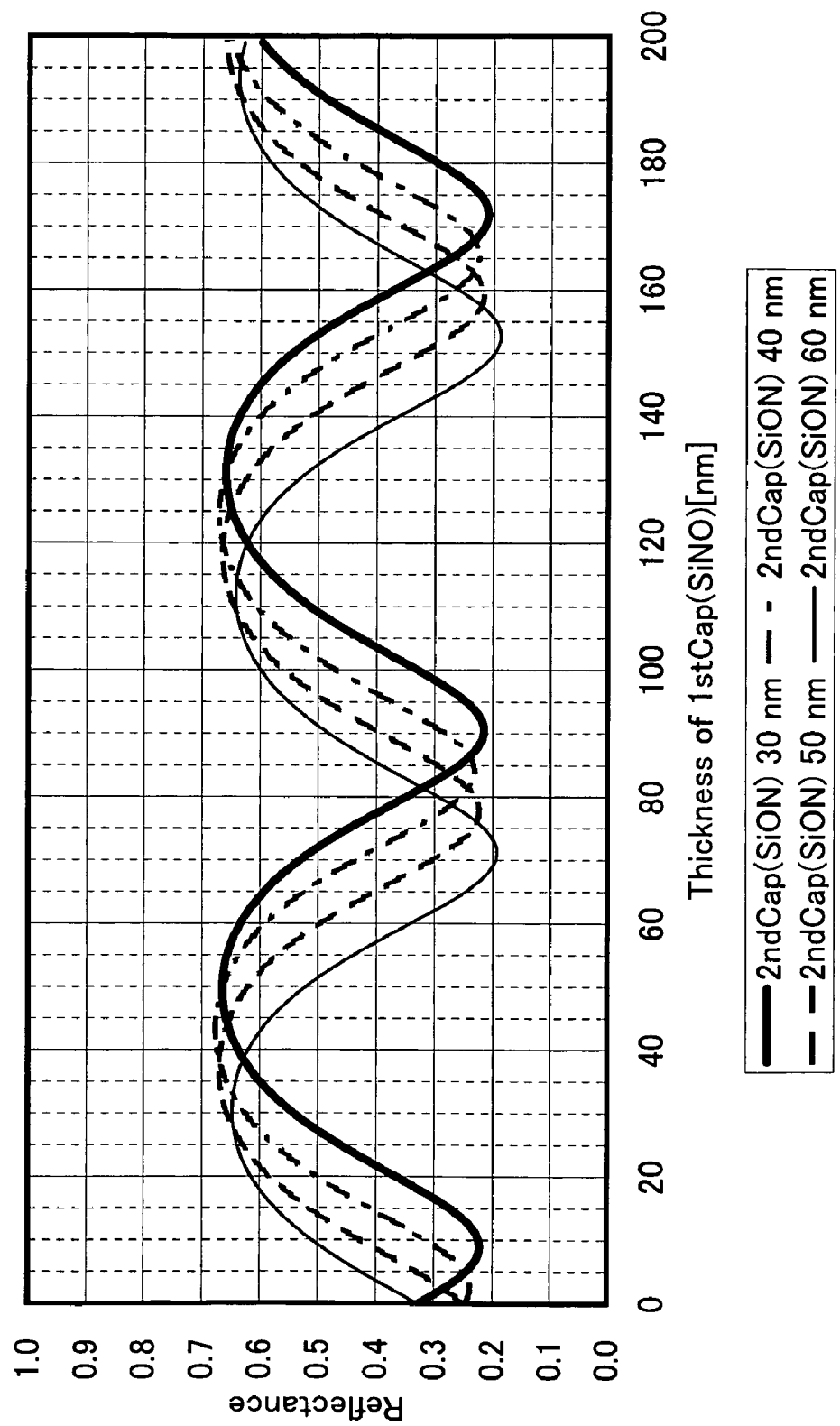
FIG. 17 illustrates reflectance of reflective films.

FIG. 17 illustrates the reflectance of cap films with varied thickness, each of which is irradiated with a laser beam having a wavelength of 308 nm.

FIG. 17 illustrates a plot of the dependency of the reflectance on the thickness of a cap film in the case where a plurality of samples were prepared, in each of which a silicon nitride oxide film (thickness: 50 nm), a silicon oxynitride film (thickness: 100 nm), and an amorphous silicon film (thickness: 54 nm) were sequentially formed over a 1737 substrate (manufactured by Corning Inc.) by CVD, and a stack of a silicon nitride oxide film (1stCap) and a silicon oxynitride film (2ndCap) which has different thickness was formed as a cap film by CVD over the amorphous silicon film.

A spectrophotometer (U-4000 SPECTROPHOTOMETER manufactured by HITACHI) was used as a measurement device.

In FIG. 17 the reflectance is higher than the state where a cap film is not formed (FIG. 15: the reflectance with respect to the thickness of 0 nm) under some conditions.

This indicates that there are some conditions under which a stack of cap films can be used as a reflective film.

Embodiment 3

Laser beam irradiation is performed by a method described in Embodiment Mode 4.

The thickness of the separate single-crystal semiconductor layer 511 formed in the first region 5001 is 100 nm, and the thickness of non-single-crystal semiconductor layer 512 formed in the second region 5002 is 50 nm.

In this case, the optimal energy density with respect to the film thickness of 100 nm is 600 mJ/cm$^2$ to 700 mJ/cm$^2$. Meanwhile, the optimal energy density with respect to the film thickness of 50 nm is 350 mJ/cm$^2$ to 450 mJ/cm$^2$. Accordingly, when the separate single-crystal semiconductor layer 511 and the non-single-crystal semiconductor layer 512 are irradiated with a laser beam all at once, in order to irradiate each of them with the optimal energy density, the separate single-crystal semiconductor layer 511 having a thickness of 100 nm should be irradiated with a laser having an energy density which is 1.5 to 2 times the energy density of a laser beam with which the non-single-crystal semiconductor layer 512 having a thickness of 50 nm is irradiated. Here, the material of the cap films, the thickness of the cap films, and the energy density of the laser beam are selected so that both of them are irradiated at an energy density of 1.75 times the energy density of a laser beam with which the non-single-crystal semiconductor layer 512 having a thickness of 50 nm is irradiated.

Then, a cap film is formed with a silicon oxynitride film having a thickness of 40 nm over the non-single-crystal semiconductor layer 512 with reference to the graph in FIG. 15. Next, laser irradiation is performed with an excimer laser beam having a wavelength of 308 nm under a condition of a laser irradiation apparatus to be 1000 mJ/cm$^2$ with respect to the energy density.

The separate single-crystal semiconductor layer 511 which is not provided with a cap film has an absorptance of about 0.4. Accordingly, the separate single-crystal semiconductor layer 511 absorbed energy of about 400 mJ per square centimeter.

On the other hand, the non-single-crystal semiconductor layer 512 provided with a cap film having a thickness of 40 nm has an absorptance of 0.7. Accordingly, the non-single-crystal semiconductor layer 512 absorbed energy of about 700 mJ per square centimeter.

As described above, with the use of a cap film, energy to be absorbed in each of the separate single-crystal semiconductor layer 511 and the non-single-crystal semiconductor layer 512 was adjusted.

Embodiment 4

In this embodiment, the result of evaluating flatness of a surface of a semiconductor layer using an atomic force microscope (AFM) after irradiating the semiconductor layer in different atmosphere will be described.

Two substrate were prepared in each of which a silicon nitride oxide film (thickness: 50 nm), a silicon oxynitride film (thickness: 100 nm), and an amorphous silicon film (thickness: 54 nm) were sequentially formed over a 1737 substrate (manufactured by Corning Inc.) by CVD.

Further, heat treatment was performed at 500° C. for one hour, and thereby hydrogen in the semiconductor was released.

After that, one of the substrates is irradiated with a laser beam in the atmosphere without providing a cap film, and the other of the substrates is irradiated with a laser beam in a nitrogen atmosphere without providing a cap film.

The laser irradiation was performed using an excimer laser which emits a laser beam having a wavelength of 308 nm.

After that, the surface flatness of the semiconductor layer was evaluated using the atomic force microscope. The evaluation result is shown in Table 5.

TABLE 5

Atmosphere dependence of flatness

|  | Atmosphere | inert atmosphere |
|---|---|---|
| Maximum peak-to-valley height (P-V) | 91.32 nm | 32.49 nm |
| Roughness average (Ra) | 10.49 nm | 2.64 nm |
| Root mean square roughness (Rms) | 12.97 nm | 3.37 nm |

The semiconductor layer irradiated with a laser beam in a nitrogen atmosphere was smaller in all of maximum peak-to-valley height (P-V), roughness average (Ra), and root mean square roughness (Rms), and it had superior flatness.

Further, in all experiments conducted several times under the similar conditions, semiconductor layers each irradiated with a laser beam at a nitrogen atmosphere exhibited lower values.

This mechanism is not clear but the present inventor considers that oxygen has an effect on the crystal growth mechanism, thereby influencing the surface morphology.

Embodiment 5

AN100 substrates (manufactured by Asahi Glass Co., Ltd.) were prepared.

Then, a silicon nitride oxide film (thickness: 50 nm) was formed over each substrate by plasma CVD using silane ($SiH_4$), dinitrogen oxide ($N_2O$), ammonia ($NH_3$), and hydrogen ($H_2$) as a film forming gas.

A silicon oxynitride film (thickness: 100 nm) was formed over each silicon nitride oxide film by plasma CVD using silane and dinitrogen oxide as a film forming gas.

Further, an amorphous silicon film (54 nm) was formed over each silicon oxynitride film by plasma CVD using silane as a film forming gas.

Then, hydrogen in the semiconductor was released by performing heat treatment at 500° C. for one hour.

After that, one of the substrate was irradiated with a laser beam in the atmosphere, and the other was irradiated with a laser beam in a nitrogen atmosphere.

Note that a cap film is not provided for either of them.

The laser beam irradiation was performed using an excimer laser which emits a laser beam having a wavelength of 308 nm.

After that, after processing each of the silicon films into an island shape, a gate insulating film (thickness: 115 nm) was formed of silicon oxynitride by plasma CVD using silane and dinitrogen oxide as a film forming gas. Next, the gate insulating film was subjected to cleaning treatment including HF treatment. The cleaning treatment reduced the thickness of the gate insulating film by approximately 5 nm. Then, a gate electrode (an electrode in which tungsten (370 nm) is stacked on tantalum nitride (30 nm)) was formed on the gate insulating film.

After that, phosphorus or boron was added to the semiconductor layers by ion doping to form an LDD region, a source region, and a drain region, and thereby an n-type transistor and a p-type transistor were formed over each of the substrates.

Next, interlayer insulating films in each which a first silicon oxide film (50 nm), a silicon nitride film (100 nm), and a second silicon oxide film (600 nm) were stacked in this order were formed by plasma CVD.

Then, heat treatment was performed at a temperature of 410° C. for one hour.

Then, contact holes were provided in the interlayer insulating films.

Then, pad portions and wirings in which titanium, titanium nitride, aluminum, and titanium were sequentially stacked were formed.

After that, a probe needle was contacted with the pad portions to measure electrical characteristics of the transistors in each region of each substrate.

The measurement results are shown below.

TABLE 6

Atmosphere dependence of device (n-channel transistor)

| | Atmosphere | inert atmosphere |
|---|---|---|
| Threshold voltage | 1.60 V | 2.71 V |
| S value | 0.21 V/dec | 0.29 V/dec |
| Field effect mobility | 92.90 cm$^2$/Vs | 35.96 cm$^2$/Vs |

TABLE 7

Atmosphere dependence of device (p-channel transistor)

| | Atmosphere | inert atmosphere |
|---|---|---|
| Threshold voltage | −1.66 V | −4.10 V |
| S value | 0.25 V/dec | 0.37 V/dec |
| Field effect mobility | 64.99 cm$^2$/Vs | 38.24 cm$^2$/Vs |

Table 6 illustrates the average of 50 n-channel transistors, and Table 7 illustrates the average of 50 p-channel transistors.

Power consumption is higher as the absolute value of the threshold voltage is higher; therefore, better characteristics can be achieved when the absolute value is lower.

An S value (also referred to as a subthreshold swing) is an index of switching characteristics of transistors, and the switching characteristics are better when the S value is small.

A field effect mobility is an index of the speed of carrier movement, and the characteristics are better when the field effect mobility is higher.

Here, as shown in Table 6 and Table 7, the electrical characteristics of both n-channel transistor and p-channel transistors were favorable when the laser beam irradiation was performed in the atmosphere.

The reason that the electrical characteristics of both n-channel transistor and p-channel transistors were favorable when the laser beam irradiation was performed in the atmosphere is not clear. However, the present inventor considers that the reason is that defects of a large number of dangling bonds created at the time of forming the amorphous silicon films are compensated by oxygen contained in the laser irradiation atmosphere.

This application is based on Japanese Patent Application serial No. 2007-132540 filed with Japan Patent Office on May 18, 2007, the entire contents of which are hereby incorporated by reference.

What is claimed is:

1. A method for manufacturing a semiconductor device, comprising the steps of:
    forming a single-crystal semiconductor layer in a first region over a substrate;
    forming a non-single-crystal semiconductor layer in a second region over the substrate so that the non-single-crystal semiconductor layer is not overlapped with the single-crystal semiconductor layer;
    forming a cap film over one of the single-crystal semiconductor layer and the non-single-crystal semiconductor layer so that the cap film does not overlap the other of the single-crystal semiconductor layer and the non-single-crystal semiconductor layer; and
    applying a laser beam from above the cap film to irradiate the first region in which the non-single-crystal semiconductor layer in the second region is not overlapped with the single-crystal semiconductor layer and the second region,
    wherein, in the step of applying the laser beam, the non-single-crystal semiconductor layer and the single-crystal semiconductor layer are not overlapped with each other.

2. The method for manufacturing a semiconductor device according to claim 1, wherein a thickness of the single-crystal semiconductor layer is larger than a thickness of the non-single-crystal semiconductor layer.

3. A method for manufacturing a semiconductor device, comprising the steps of:
    forming a single-crystal semiconductor layer in a first region over a substrate;
    forming a non-single-crystal semiconductor layer in a second region over the substrate so that the non-single-crystal semiconductor layer is not overlapped with the single-crystal semiconductor layer;
    forming a first cap film over the single-crystal semiconductor layer;
    forming a second cap film over the non-single-crystal semiconductor layer; and
    applying a laser beam from above the first cap film and the second cap film to irradiate the first region in which the non-single-crystal semiconductor layer in the second region is not overlapped with the single-crystal semiconductor layer and the second region,
    wherein, in the step of applying the laser beam, the non-single-crystal semiconductor layer and the single-crystal semiconductor layer are not overlapped with each other, and
    wherein the first cap film and the second cap film do not overlap with each other.

4. The method for manufacturing a semiconductor device according to claim 3, wherein reflectance of the first cap film is different from reflectance of the second cap film.

5. The method for manufacturing a semiconductor device according to claim 3, wherein a thickness of the single-crystal semiconductor layer is larger than a thickness of the non-single-crystal semiconductor layer.

6. A method for manufacturing a semiconductor device, comprising the steps of:
    forming a non-single-crystal semiconductor film over a substrate;
    removing the non-single-crystal semiconductor film in a first region, thereby forming a non-single-crystal semiconductor layer in a second region over the substrate;
    doping or implanting ion species into a single-crystal semiconductor substrate, thereby forming an ion layer in a region at a predetermined depth from a surface of the single-crystal semiconductor substrate;
    forming a bond layer over the surface of the single-crystal semiconductor substrate;
    attaching the bond layer to the first region over the substrate;
    applying energy to the single-crystal semiconductor substrate to create a crack in the ion layer, thereby leaving a single-crystal semiconductor layer in the first region over the substrate;
    forming a cap film over one of the single-crystal semiconductor layer and the non-single-crystal semiconductor layer so that the cap film does not overlap the other of the single-crystal semiconductor layer and the non-single-crystal semiconductor layer; and
    applying a laser beam from above the cap film to irradiate the first region in which the non-single-crystal semiconductor layer in the second region is not overlapped with the single-crystal semiconductor layer and the second region, wherein, in the step of applying the laser beam, the non-single-crystal semiconductor layer and the single-crystal semiconductor layer are not overlapped with each other.

7. The method for manufacturing a semiconductor device according to claim 6, further comprising the steps of:
   forming a driver circuit in the first region; and
   forming a pixel area having a liquid crystal display element in the second region.

8. The method for manufacturing a semiconductor device according to claim 6, further comprising the steps of:
   forming a pixel area having an electroluminescent display element in the first region; and
   forming a driver circuit in the second region.

9. The method for manufacturing a semiconductor device according to claim 6, further comprising the steps of:
   forming an analog circuit in the first region; and
   forming a digital circuit in the second region.

10. The method for manufacturing a semiconductor device according to claim 6,
    wherein energy of the laser beam is set under an optimal condition found by evaluation using a laser irradiation test substrate formed from a non-single-crystal semiconductor.

11. The method for manufacturing a semiconductor device according to claim 6, wherein a thickness of the single-crystal semiconductor layer is larger than a thickness of the non-single-crystal semiconductor layer.

12. A method for manufacturing a semiconductor device, comprising the steps of:
    forming a non-single-crystal semiconductor film over a substrate;
    removing the non-single-crystal semiconductor film in a first region, thereby forming a non-single-crystal semiconductor layer in a second region over the substrate;
    forming a cap film over the first region and the second region, after removing the non-single-crystal semiconductor film;
    doping or implanting ion species into a single-crystal semiconductor substrate, thereby forming an ion layer in a region at a predetermined depth from a surface of the single-crystal semiconductor substrate;
    forming a bond layer over the surface of the single-crystal semiconductor substrate;
    attaching the bond layer to the cap film in the first region, after forming the cap film;
    applying energy to the single-crystal semiconductor substrate to create a crack in the ion layer, thereby leaving a single-crystal semiconductor layer in the first region; and
    applying a laser beam from above the cap film to irradiate the first region in which the non-single-crystal semiconductor layer in the second region is not overlapped with the single-crystal semiconductor layer and the second region, after leaving the single-crystal semiconductor layer in the first region,
    wherein, in the step of applying the laser beam, the non-single-crystal semiconductor layer and the single-crystal semiconductor layer are not overlapped with each other.

13. The method for manufacturing a semiconductor device according to claim 12, further comprising the steps of:
    forming a driver circuit in the first region; and
    forming a pixel area having a liquid crystal display element in the second region.

14. The method for manufacturing a semiconductor device according to claim 12, further comprising the steps of:
    forming a pixel area having an electroluminescent display element in the first region; and
    forming a driver circuit in the second region.

15. The method for manufacturing a semiconductor device according to claim 12, further comprising the steps of:
    forming an analog circuit in the first region; and
    forming a digital circuit in the second region.

16. The method for manufacturing a semiconductor device according to claim 12,
    wherein energy of the laser beam is set under optimal conditions found by evaluation using a laser irradiation test substrate formed from a non-single-crystal semiconductor.

17. The method for manufacturing a semiconductor device according to claim 12, wherein a thickness of the single-crystal semiconductor layer is larger than a thickness of the non-single-crystal semiconductor layer.

18. A method for manufacturing a semiconductor device, comprising the steps of:
    forming a non-single-crystal semiconductor film over a substrate;
    removing the non-single-crystal semiconductor film in a first region, thereby forming a non-single-crystal semiconductor layer in a second region over the substrate;
    doping or implanting ion species into a single-crystal semiconductor substrate, thereby forming an ion layer in a region at a predetermined depth from a surface of the single-crystal semiconductor substrate;
    forming a bond layer over the surface of the single-crystal semiconductor substrate;
    attaching the bond layer to the first region over the substrate;
    applying energy to the single-crystal semiconductor substrate to create a crack in the ion layer, thereby leaving a single-crystal semiconductor layer in the first region;
    forming a first cap film over the single-crystal semiconductor layer;
    forming a second cap film over the non-single-crystal semiconductor layer; and
    applying a laser beam from above the first cap film and the second cap film to irradiate the first region and the second region,
    wherein reflectance of the first cap film is different from reflectance of the second cap film, and
    wherein the first cap film and the second cap film do not overlap with each other.

19. The method for manufacturing a semiconductor device according to claim 18, further comprising the steps of:
    forming a driver circuit in the first region; and
    forming a pixel area having a liquid crystal display element in the second region.

20. The method for manufacturing a semiconductor device according to claim 18, further comprising the steps of:
    forming a pixel area having an electroluminescent display element in the first region; and
    forming a driver circuit in the second region.

21. The method for manufacturing a semiconductor device according to claim 18, further comprising the steps of:
    forming an analog circuit in the first region; and
    forming a digital circuit in the second region.

22. The method for manufacturing a semiconductor device according to claim 18,
    wherein energy of the laser beam is set under optimal conditions found by evaluation using a laser irradiation test substrate formed from a non-single-crystal semiconductor.

23. The method for manufacturing a semiconductor device according to claim 18, wherein a thickness of the single-crystal semiconductor layer is larger than a thickness of the non-single-crystal semiconductor layer.

* * * * *